United States Patent [19]

Hatashita et al.

[11] Patent Number: 5,481,670
[45] Date of Patent: Jan. 2, 1996

[54] METHOD AND APPARATUS FOR BACKUP IN A MULTI-MEMORY DEVICE

[75] Inventors: Toyohito Hatashita; Motoharu Taura; Toshihiko Shimizu; Hiroshi Umeoka, all of Kanagawa, Japan

[73] Assignee: Mitsubishi Denki Kabushiki Kaisha, Tokyo, Japan

[21] Appl. No.: 98,806

[22] Filed: Jul. 28, 1993

[30]  Foreign Application Priority Data

Oct. 14, 1992 [JP] Japan ..................................... 4-275739

[51] Int. Cl.⁶ .................................................... G11C 29/00
[52] U.S. Cl. ...................................................... 395/182.05
[58] Field of Search ........................... 371/10.1; 395/575; 364/245.3, 268.5, 269.1, 285.1, 944, 970.1

[56]  References Cited

U.S. PATENT DOCUMENTS

| | | | |
|---|---|---|---|
| 4,150,428 | 4/1979 | Inrig et al. | 364/200 |
| 4,380,812 | 4/1983 | Ziegler, II et al. | 371/38 |
| 4,597,084 | 6/1986 | Dynneson et al. | 371/51.1 |
| 4,603,406 | 7/1986 | Miyazaki | 371/10.1 X |
| 4,849,978 | 7/1989 | Dishon | 371/10.1 |
| 5,177,744 | 1/1993 | Cesare | 371/10.1 |
| 5,197,026 | 3/1993 | Butler | 365/104 |
| 5,325,333 | 7/1994 | Sato | 371/10.1 X |

FOREIGN PATENT DOCUMENTS 4-115340  4/1992  Japan .

*Primary Examiner*—Robert W. Beausoliel, Jr.
*Assistant Examiner*—Glenn Snyder
*Attorney, Agent, or Firm*—Wolf, Greenfield & Sacks

[57]  ABSTRACT

A multi-memory apparatus, configured only with identical memory units with access to the common system bus, provides secure data identity in the event of various errors by using synchronous as well as parallel operation. A memory unit in a multi-memory apparatus includes a refresh request circuit, a bus control circuit, a bus-response circuit as well as a control circuit. A master refresh request circuit issues a memory-refresh request by using the bus clock and a backup refresh request circuit issues a memory-refresh request by a trigger from the master memory. A master bus control circuit responds to the system bus and a backup bus control circuit prohibits the unit from responding. A master bus-response control circuit allows the bus control circuit to respond to the system bus and changes mode between memory units from master/backup to backup/master in the event of an error detected in the master memory unit.

13 Claims, 32 Drawing Sheets

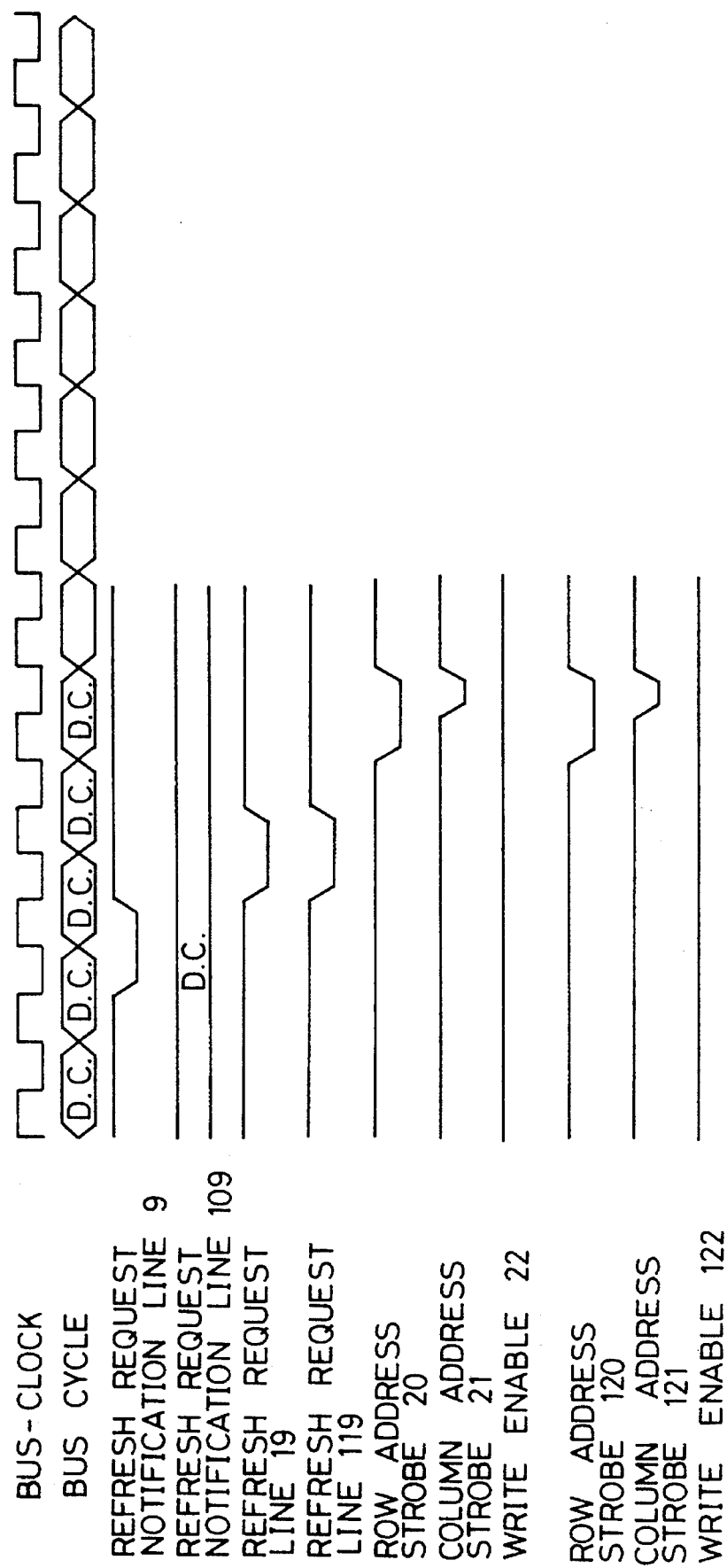

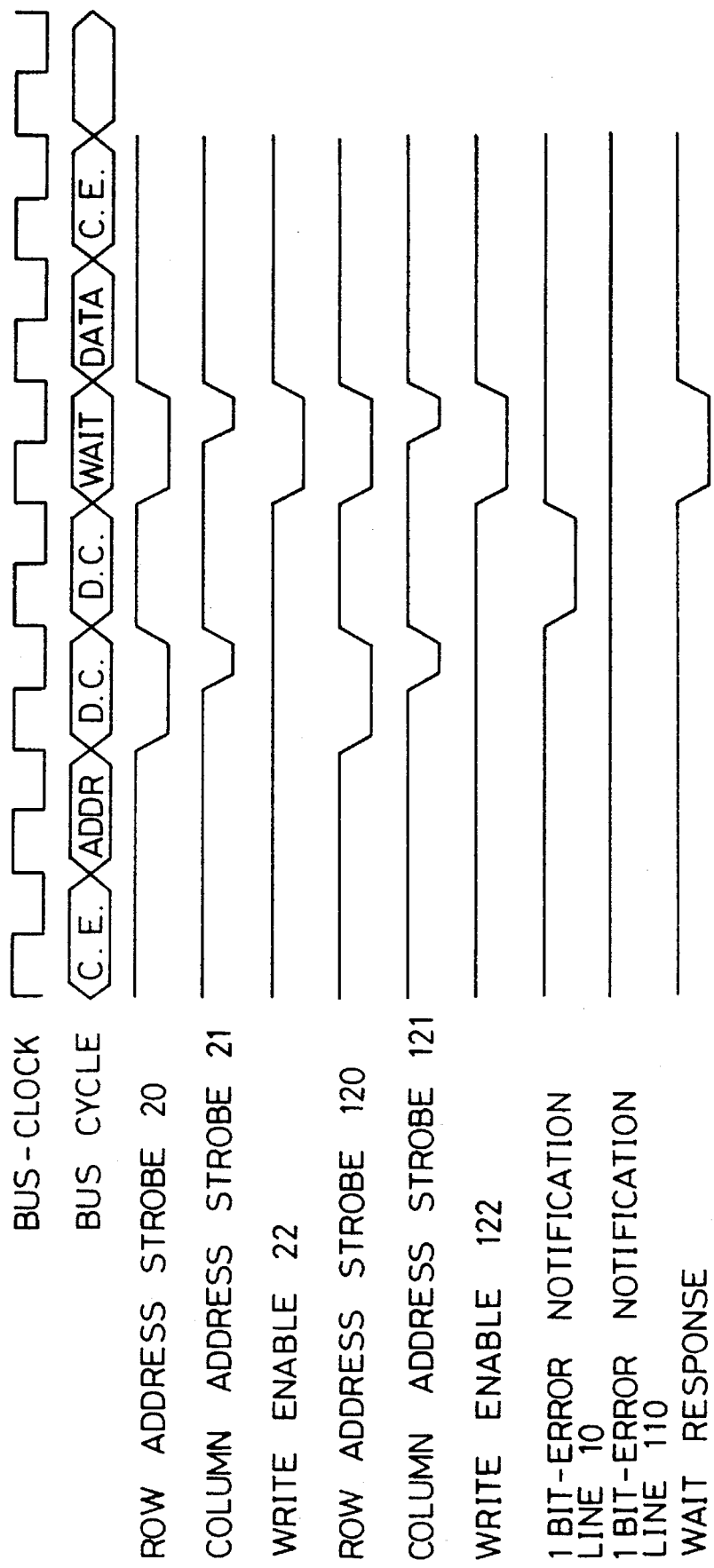

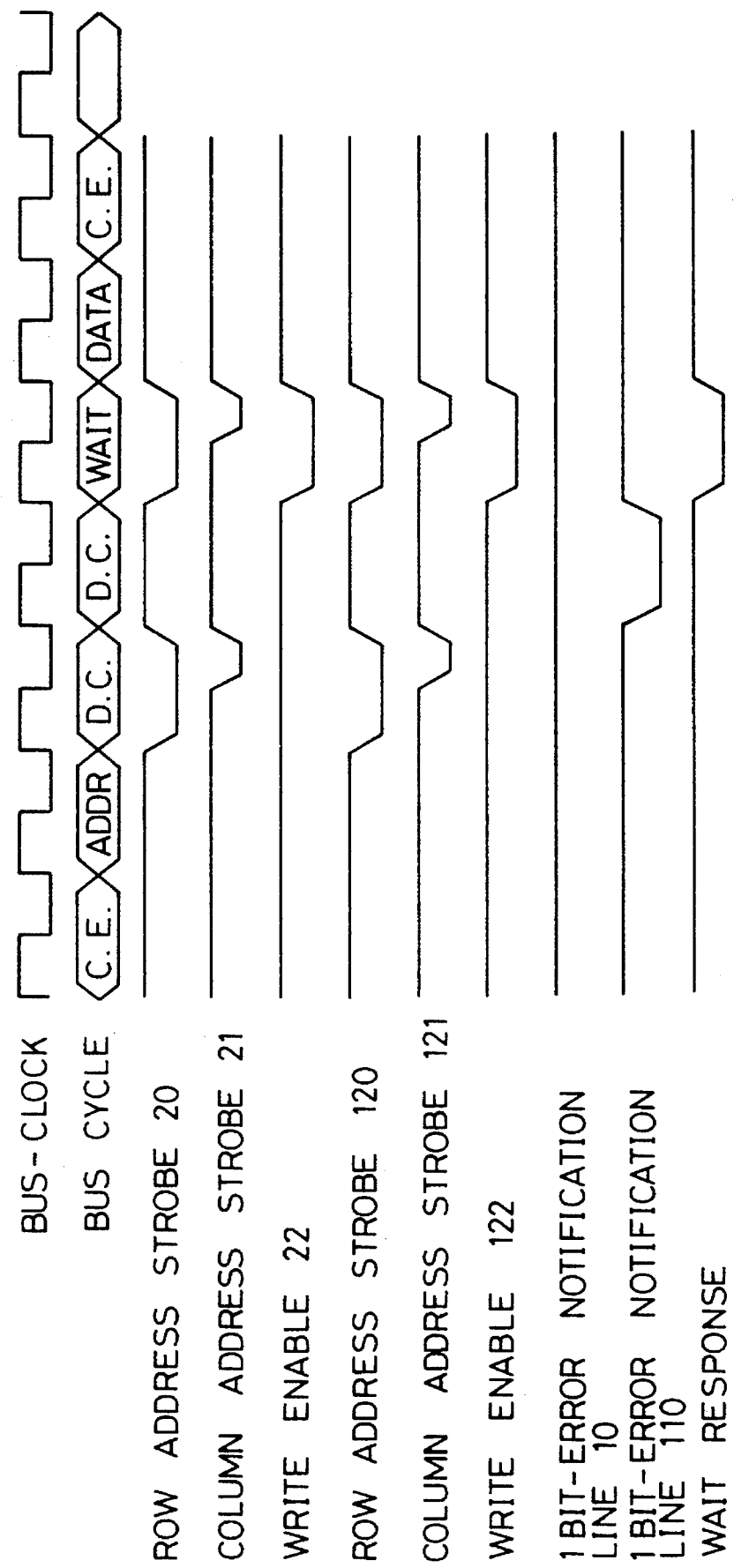

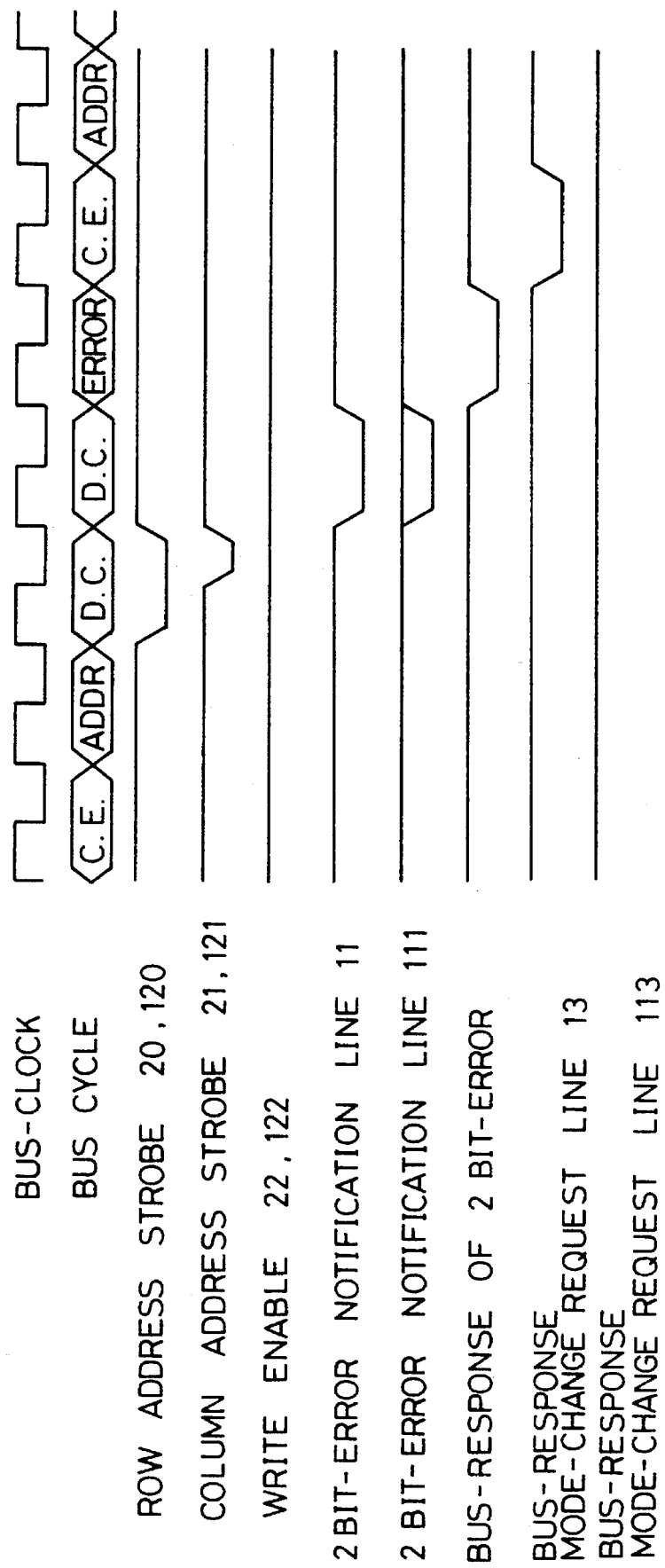

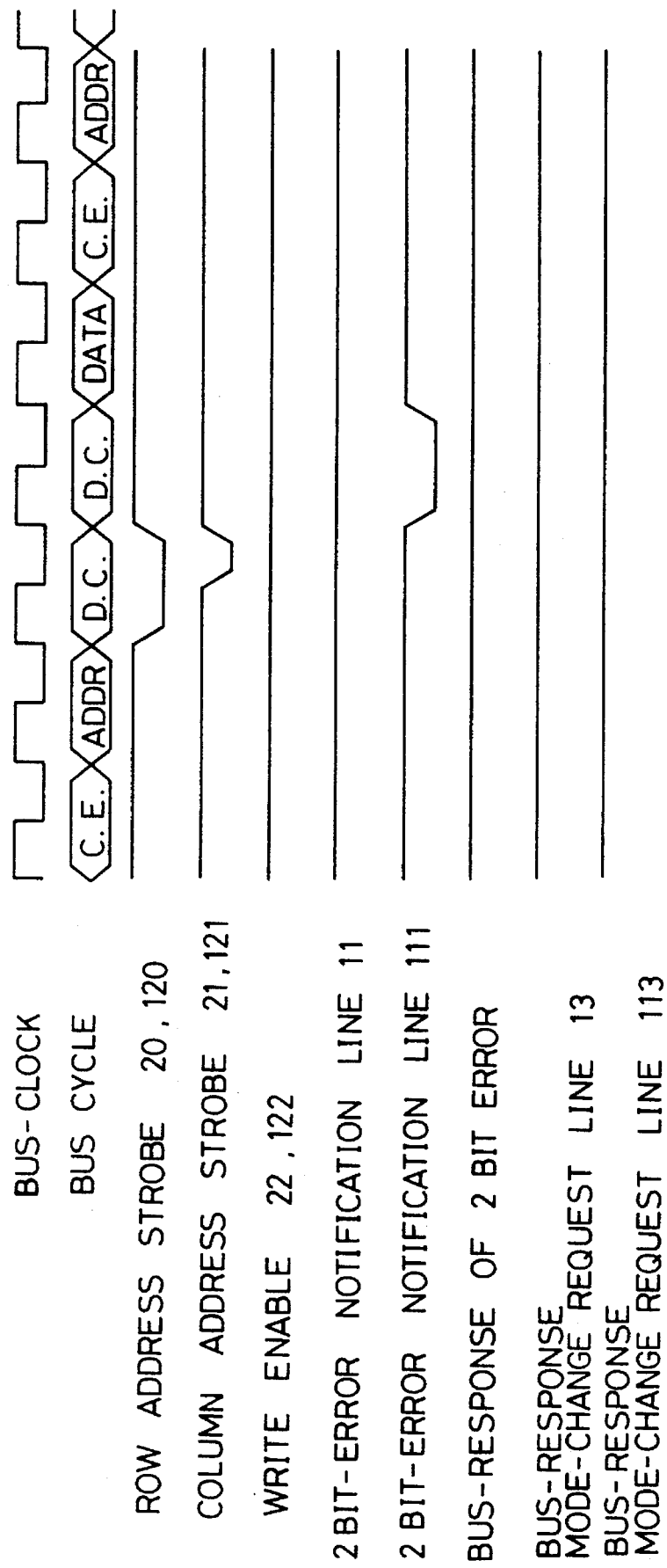

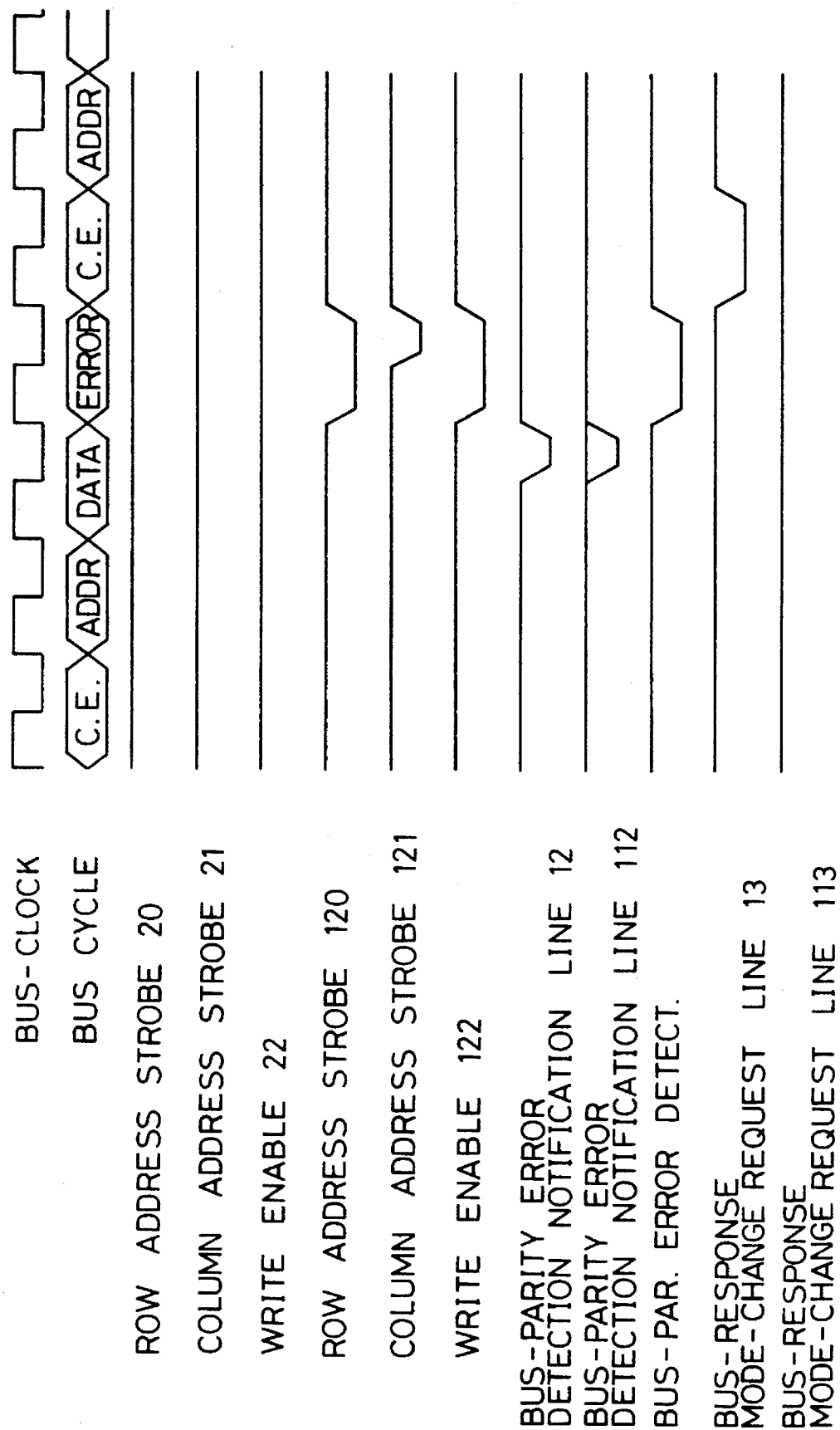

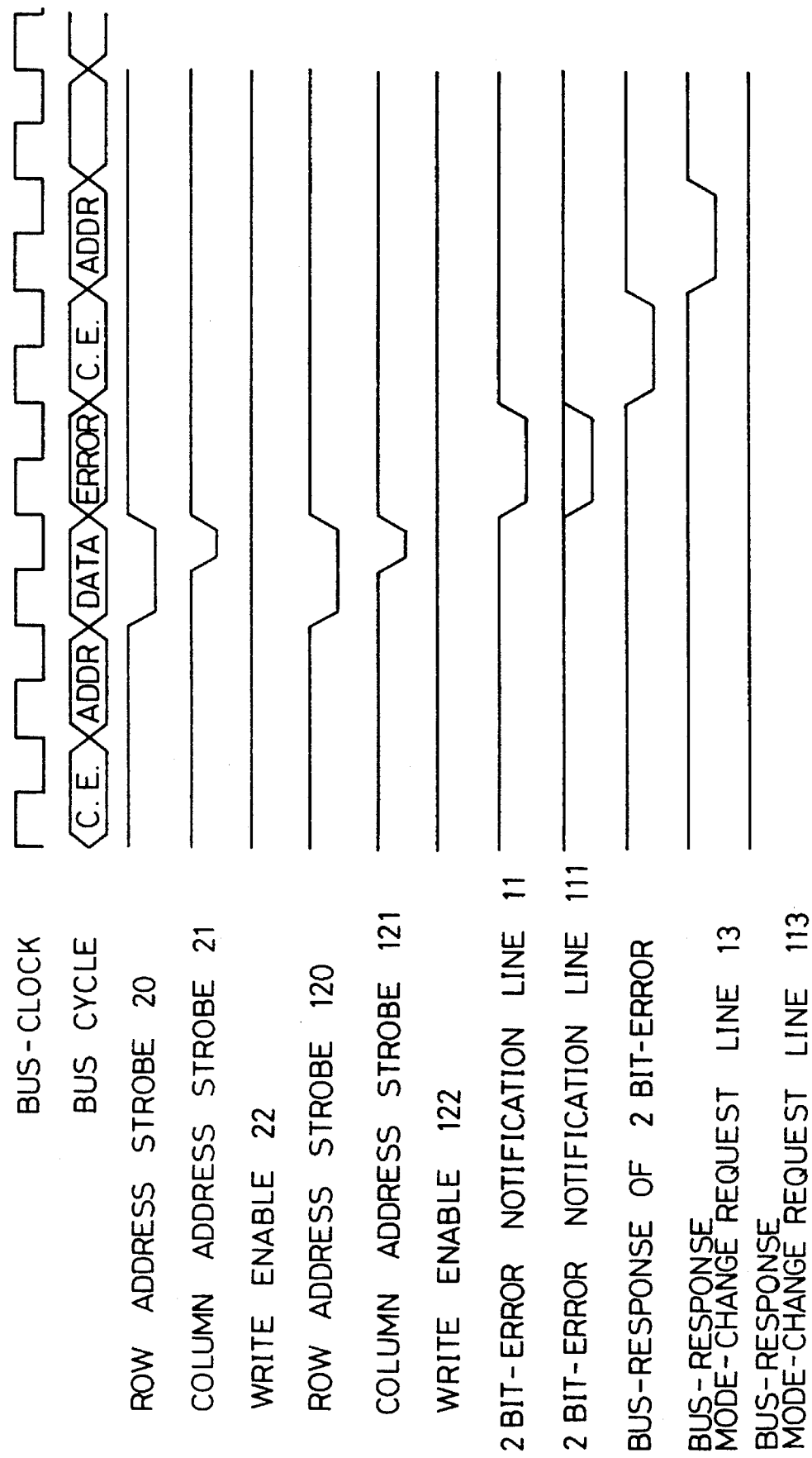

METHOD AND APPARATUS FOR BACKUP IN A MULTI-MEMORY DEVICE

BACKGROUND OF THE INVENTION

1. Field of the Invention

This invention relates to multi-memory apparatus, which includes two or more identical memory units with access to a common system bus (a standard bus), and methods that provide a secure memory performance in the event that various kinds of errors or fault conditions occur, whether employing essentially synchronous or parallel operation, without interruption. The invention thus provides a highly reliable multi-memory apparatus.

2. Description of the Related Art

FIG. 27 shows a conventional example of a multi-memory apparatus and its system configuration. As the figure illustrates the conventional multi-memory apparatus includes a pair of identical memory arrays 601 and 602, a pair of identical error detectors 608 and 609 and some functional elements such as a control circuit 611, an error corrector 610 and an output selector 613.

The operation of the conventional apparatus is now described with reference to the figure. When a read address is specified on a read address line 600, the address is stored in address selectors 603. 604, which are used to access the memory arrays 601 and 602 and thereby read memory data in parallel out of the specified addressed location into read registers 606 and 607, respectively. The read data from the memory arrays 601 and 602, in the absence of an error detected in the error detectors 608 and 609, are available for output. The error detectors provide an Input to a control circuit 611, which connects to an output selector 613. If there is no error, the output selector 618 selects either of them as output data.

When an error is detected in either of the error detectors, 608 or 609, the control circuit 611 receives the result of error detection. When an error is detected in the error detector 608, in other words a read error in the memory array 601, for example, the control circuit 611 informs the output selector 613 of the error in the memory circuit 601. The output selector 613 consequently selects the read data of the memory array 602 for output onto an output line 661.

In the meantime the error is corrected in the error corrector 610. The corrected data is written back into the memory array 601 in parallel with the output operation, using the address stored in write address register 605 and the content of the write flag register 612.

A similar operation occurs when an error is detected in the error detector 609, and a correction is made by corrector 610 and provided to memory array 602.

FIG. 28 shows another example of a conventional multi-memory apparatus illustrating a parallel operation with backup units. In the figure a master memory unit 712 and a backup memory unit 713 are identical and operate in parallel. In this system, data for output onto a data bus, which is not illustrated in the figure, generally is selected from the master memory unit. However, if there is an error detected in the master memory unit 712, the backup unit 713 will be selected. To secure parallel operation between the two memory units, they are controlled by a wired-OR technique employing OR gates 722 in the master memory unit and 732 in the backup memory unit. In other words, a bus-response operation has to be delayed until the both units gain a synchronous condition completing the whole course of the current response operation. A mode-change operation from/to master to/from backup between the memory units in the event of an error need not be described here, as it is well known.

The conventional art, therefore, leaves some challenges from an architectural point of view. As mentioned hereinbefore, the conventional multi-memory apparatus requires many additional functional elements, such as at least control circuits, for selecting correct data from between the memory units and output selectors. In other words, the conventional art requires more than a system configuration consisted of just two or more identical memory units to acquire synchronous backup operation in the system.

Besides, the conventional art provides no measures of securing synchronous as well as parallel operation among the memory units in the system when a new memory unit is replaced with a damaged master memory unit in the event of an error or failure detected in the master memory unit.

SUMMARY OF THE INVENTION

This invention aims at solving the foregoing problems. It is an object of the present invention to provide a multi-memory apparatus and methods which can maintain synchronous as well as parallel operation among the memory units in the system without interruption in the event that various errors occur. Another object of the present invention is to provide a multi-memory apparatus and methods which stop further bus-response operation in the master memory unit in the event of unrecoverable errors, which can damage the whole system operation. A further object of the present invention is to provide a multi-memory apparatus and methods which assure the identity of data within of the memory units in the system, even when there is a new replacement memory unit.

A multi-memory apparatus according to the present invention includes plural identical memory units each of which operates in either a master mode, wherein the memory unit functions as a master memory or a backup mode wherein the memory units function as backup memories. The memories are connected to a system bus, each memory unit comprising:

(A) a refresh request circuit for issuing memory-refresh request, by using a bus clock on the system bus while the memory unit is in master mode, and using a trigger from the master memory while the memory unit is in a backup mode;

(B) a bus control circuit for responding to the system bus while the memory unit is in the master mode, and for prohibiting a response to the system bus while the memory unit is in backup mode; and, (C) a bus-response control circuit for allowing the bus control circuit to respond to the system bus while the memory unit is in the master mode, for requesting the backup memory to change into a master mode in case of detecting an error in the master memory, and for prohibiting the bus control circuit from responding to the system bus while the memory unit is in backup mode.

Further in accord with the invention, a multi-memory apparatus includes a memory unit which comprises an error flag register which holds the error status in case of detecting an error, changes mode from a master mode into a backup mode and requests the backup memory to change into a master mode in case of detecting the error in the master memory, and prevents any further changes from a backup mode when the error flag register holds an error status.

Further in accord with the invention, a multi-memory apparatus includes a memory unit which further comprises a memory array for storing data, a memory control circuit for providing data access in the memory array, and for responding to the system bus through the bus control circuit after changing a backup mode into a master mode in case that a specific error is detected in the memory array of the previous master memory.

Further in accord with the invention, a multi-memory apparatus includes a bus control circuit which has a bus-parity error detection circuit for comparing each bus-parity error detected in each memory unit, providing the bus-parity error to the system bus after detecting the bus-parity error in the master memory, and requesting the backup memory to change mode into a master mode in case that bus-parity error is detected in the master memory and the bus-parity error detected in the master memory is different from the bus-parity error detected in the backup memory.

Further in accord with the invention, a multi-memory apparatus includes a copy-status register which is set to ready, after a backup memory unit has been connected to the system bus and copying data from the master memory at a specific addresses, and for preventing the memory unit from being used as the backup memory until completion of the copying data.

Further in accord with the invention, a multi-memory apparatus includes plural identical memory units each of which operates in either a master mode, wherein the memory unit functions as a master memory, or a backup mode, wherein the memory units function as a backup memory. The memories are connected to the system bus, each memory unit comprising:

(A) a memory array for storing data;

(B) a bus control circuit for responding to the system bus while the memory unit is in the master mode, and for prohibiting a response to the system bus while the memory unit is in backup mode;

(C) a bus-response control circuit for allowing the bus control circuit to respond to the system bus while the memory unit is in the master mode, for requesting the backup memory to change into a master mode in case of detecting an error in the master memory, and for prohibiting the bus control circuit from responding to the system bus while the memory unit is in a backup mode; and, (D) a memory control circuit for controlling data access in the memory array, informing other memory units of the completion of a data access, and delaying a data access until completion of a refresh in the memory unit.

Further in accord with the invention, a multi-memory apparatus employs a method of preparing a backup memory which operates in a backup mode, the method comprising the steps of:

(A) setting a copy-status register to a not-ready state for a backup memory, after connecting the memory to the system bus;

(B) checking a read/write function of the backup memory using specific memory address;

(C) copying data to memory addresses of the backup memory by
  (C1) reading data at each memory address from a master memory;
  (C2) rewriting the same data immediately after the reading step into the same address of the master memory, and writing the same data into the same address in the backup memory;
  (C3) repeating the reading steps (C1) and the writing steps (C2) to plural addresses of the memories; and, (D) setting the copy-status register ready after completion of the copying of all required data.

Further in accord with the invention, a multi-memory apparatus employs a method of responding to the system bus from a multi-memory apparatus, which includes plural identical memory units each of which operates in either a master mode wherein the memory unit functions as a master memory, or a backup mode, wherein the memory units function as backup memories. The method comprises the steps of:

(A) requesting a memory-refresh by using a bus clock while a memory unit is in the master mode, and a trigger from the master memory while a memory unit is in the backup mode;

(B) controlling a bus control circuit to allow a response to the system bus while the memory unit is in a master mode, and to prohibit a response to the system bus while the memory unit is in a backup mode;

(C) asking for a backup memory to change to a master mode after detecting an error in the master mode memory; and.

(D) responding to the system bus while the memory unit is in a master mode, and allowing only reception of commands and data from the system bus while the memory unit is in a backup mode.

BRIEF DESCRIPTION OF THE DRAWINGS

FIG. 3 shows a set of timing diagrams illustrating a refresh operation in a multi-memory apparatus of the invention shown in FIGS. 1 to 2(c);

FIG. 4 shows a set of timing diagrams illustrating an operation of a multi-memory apparatus of the invention in the event of a one-bit read error detected in the master memory;

FIG. 5 shows a set of timing diagrams illustrating an operation of a multi-memory apparatus of the invention in FIG. 1 in the event of a one-bit read error detected in the backup memory;

FIG. 8 shows a set of timing diagrams illustrating an operation of a multi-memory apparatus of the invention in FIG. 1 in the event of a two-bit read error detected in the master memory;

FIG. 9 shows a set of timing diagrams illustrating an operation of a multi-memory apparatus of the invention in FIG. 1 in the event of a two-bit read error detected only in the backup memory;

FIG. 11 shows a set of timing diagrams illustrating an operation of a multi-memory apparatus of the invention in the event of a bus-parity error detected in the master memory;

FIG. 13 shows a set o timing diagrams illustrating an operation of a multi-memory apparatus of the invention in the event of a two-bit read error detected in the master memory in the midst of a read-modify-write operation;

FIG. 15 shows a flow chart illustrating operating sequences for replacing a damaged memory unit with a new one while power is on;

DESCRIPTION OF THE PREFERRED EMBODIMENTS

Figure 1:
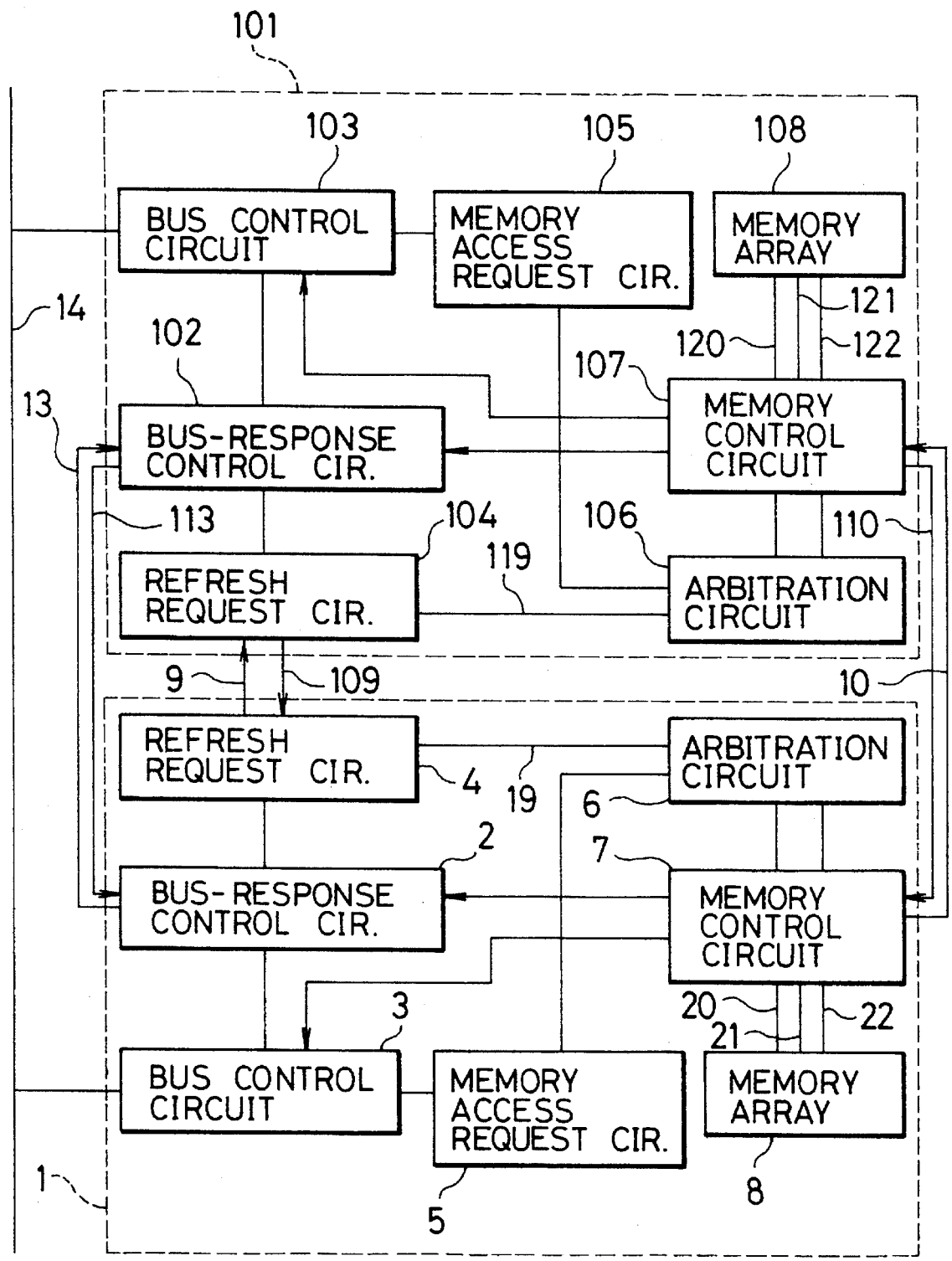
FIG. 1 shows a block diagram illustrating a configuration of a multi-memory apparatus according to an embodiment of the present invention.

FIG. 1 shows a system configuration of a multi-memory apparatus according to an embodiment of the present invention. The embodiment represents the basic configuration and operation of a multi-memory apparatus of the invention. The invention features a multi-memory apparatus configured with two or more identical memory units with access to the common standard system bus. The apparatus comprises a memory unit in master mode (which will be called a "master memory" hereinafter) which responds to the bus master and one or more memory units in backup mode (each of which will be called a "backup memory" hereinafter) which follow (s) commands from the bus master except for response. A multi-memory apparatus in FIG. 1 has a memory unit 1 and its identical partner memory unit 101. The memory unit 1 includes a bus-response control circuit 2 (a bus-response control means), a bus control circuit 3 (a bus-control/bus-parity-error-detection means), a refresh request circuit 4 (a refresh request means), a memory access request circuit S (an address decode means), an arbitration circuit 6, a memory control circuit 7 (a memory control as well as one/two-bit read error detection means), a memory array 8 which uses dynamic memory, a refresh request line 19, a RAS line 20, a CAS line 21, a WE line 22, and an I/O line to a system bus 14. The memory unit 101 has corresponding functional units to those of the memory unit 1, including a bus-response control circuit 102 (a bus-response control means), a bus control circuit 103 (a bus-parity detection means), a refresh request circuit 104 (a refresh request means), a memory access request circuit 105 (an address decode means), an arbitration circuit 106, a memory control circuit 107 (a one/two-bit read error detection means), a memory array 108 which employs dynamic memory, a refresh request line 119. a RAS line 120, a CAS line 121, a WE line 122, and an I/O line to the system bus 14. The memory units 1 and 101 have communication lines linking each other, such as refresh request notification lines 9 and 109, one-bit read error notification lines 10 and 110, and bus-response mode-change request lines 13 and 113. Thus, a multi-memory apparatus of the invention is correspondingly configured with two or more identical memory units.

The normal operation of a multi-memory apparatus in FIG. 1 is now described.

Assuming that the memory unit 1 is a master memory and the memory unit 101 is a backup memory, the bus-response control circuit 102 in the backup mode does not allow the bus control circuit 103 to output signals or read data for response onto the system bus 14. Under such a condition the backup memory 101 performs a read/write operation from/to the memory array 108 and also checks bus-parity as well as one/two-bit read errors within the unit.

The memory array 8, using dynamic memory, requires a constant refresh operation for its memory data.

The refresh request circuit 4 issues a refresh request regularly to the arbitration circuit 6 by using the basic clock on the system bus 14. When a refresh request and a memory access request issued in the memory access request circuit 5 occur coincidentally, the arbitration circuit 6 arbitrates between them and chooses one of them to be processed in the memory control circuit 7.

Figure 2A:
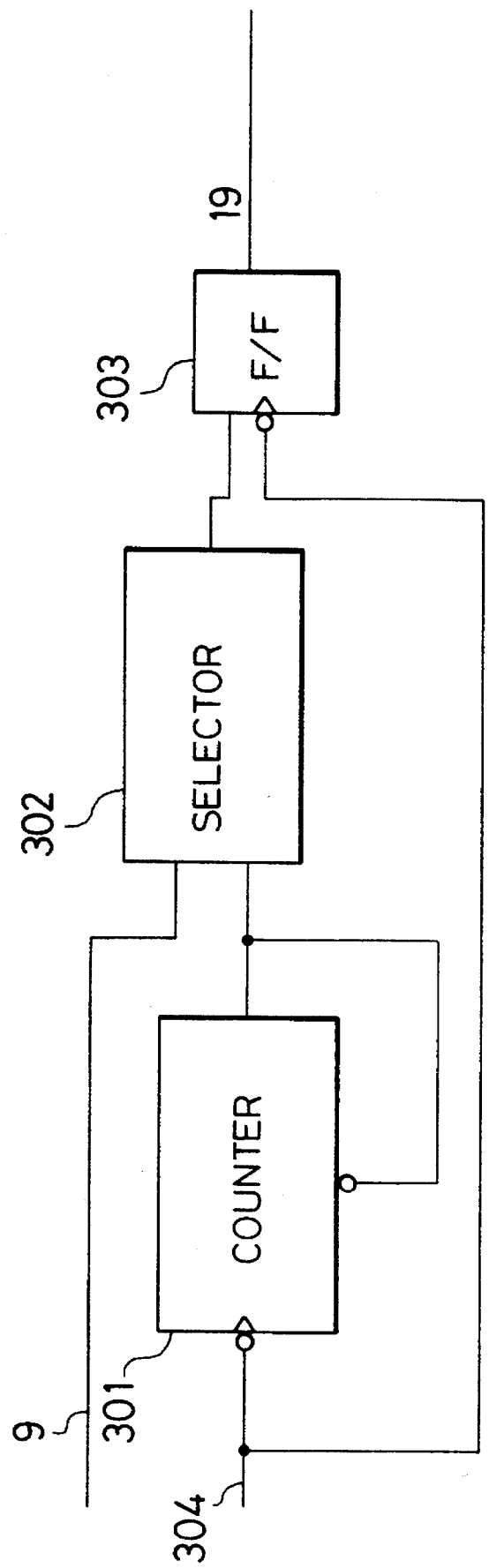
FIG. 2(a) shows the refresh request circuit in FIG. 1 according to the invention.
Figure 2B:
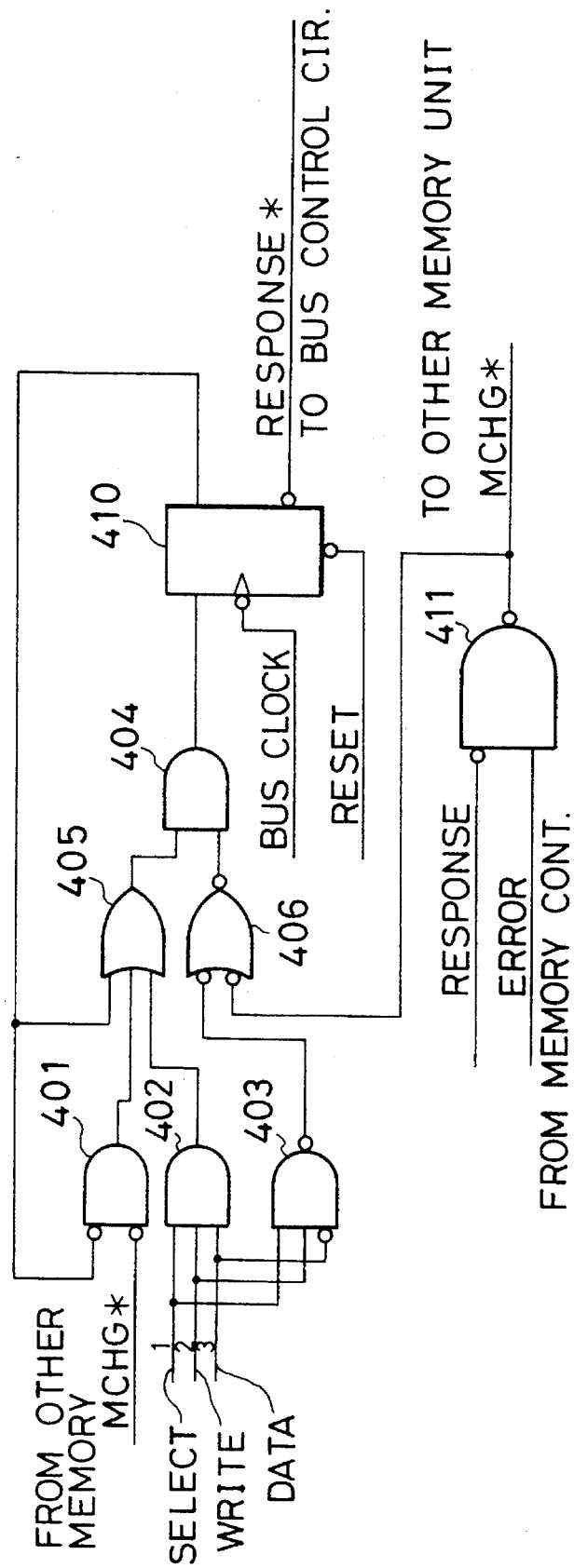
FIG. 2(b) shows the bus-response control circuit in FIG. 1 according to the invention.
Figure 2C:
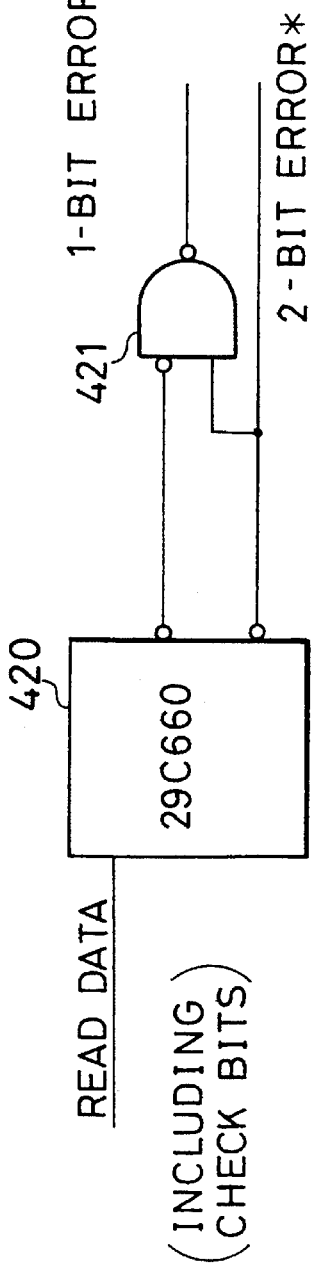
FIG. 2(c) shows the read error detection circuit in the memory control circuit in FIG. 1.

FIG. 2(a) shows the refresh request circuit 4 in FIG. 1, which has a counter 301, a selector 302, a flipflop 303, and a basic bus clock line 304. FIG. 3 shows a set of timing diagrams illustrating operation of refreshing memory data in the multi-memory apparatus in FIG. 1. FIG. 2(b) shows the bus-response control circuit in FIG. 1. The bus-response control circuit comprises logic elements 401 through 410, including AND, OR, NOR and NAND gates and a flipflop 411. The FIG. 2(c) shows a read error detection circuit 420, the AMD 29C660 for instance, and a NAND gate 421 in the memory control circuit in FIG. 1.

A refresh operation in the refresh request circuit in a multi-memory apparatus of the invention is now described with reference to FIGS. 1 through 3.

Assuming that the memory unit 101 is in backup mode, the refresh request circuit 104 receives a refresh request issued in the partner refresh request circuit 4 in a master memory 1 by way of the refresh request notification line 9. The circuit 104 issues a refresh request with the refresh request on the notification line in the manner shown in FIG. 3: a selector 1302 in the refresh request circuit 104 (corresponding to 302 in the refresh request circuit 4) receives a refresh request on the notification line 9 and issues a trigger for the refresh request. On the other hand a selector 302 in the refresh request circuit 4 of a master memory 1 chooses an input from a counter 301. The same operation can be applied to a refresh operation in a single-memory apparatus. Consequently, refresh requests occur simultaneously in the refresh request circuits 4 and 104. In other words the master and backup memory units execute refresh operation simultaneously in their memory arrays. Refresh operation, therefore, is performed synchronously in parallel in the master and backup memory units without interruption.

The following describes operation of a multi-memory apparatus of the invention in the event of various errors. This embodiment adopts an ECC method for read/write data. Error data through the ECC method should generally be written back Into the memory array.

Operation in the event of a one/two-bit read error is now described under the condition that the memory unit 1 is in master mode and the memory unit 101 is in backup mode.

Figure 6:
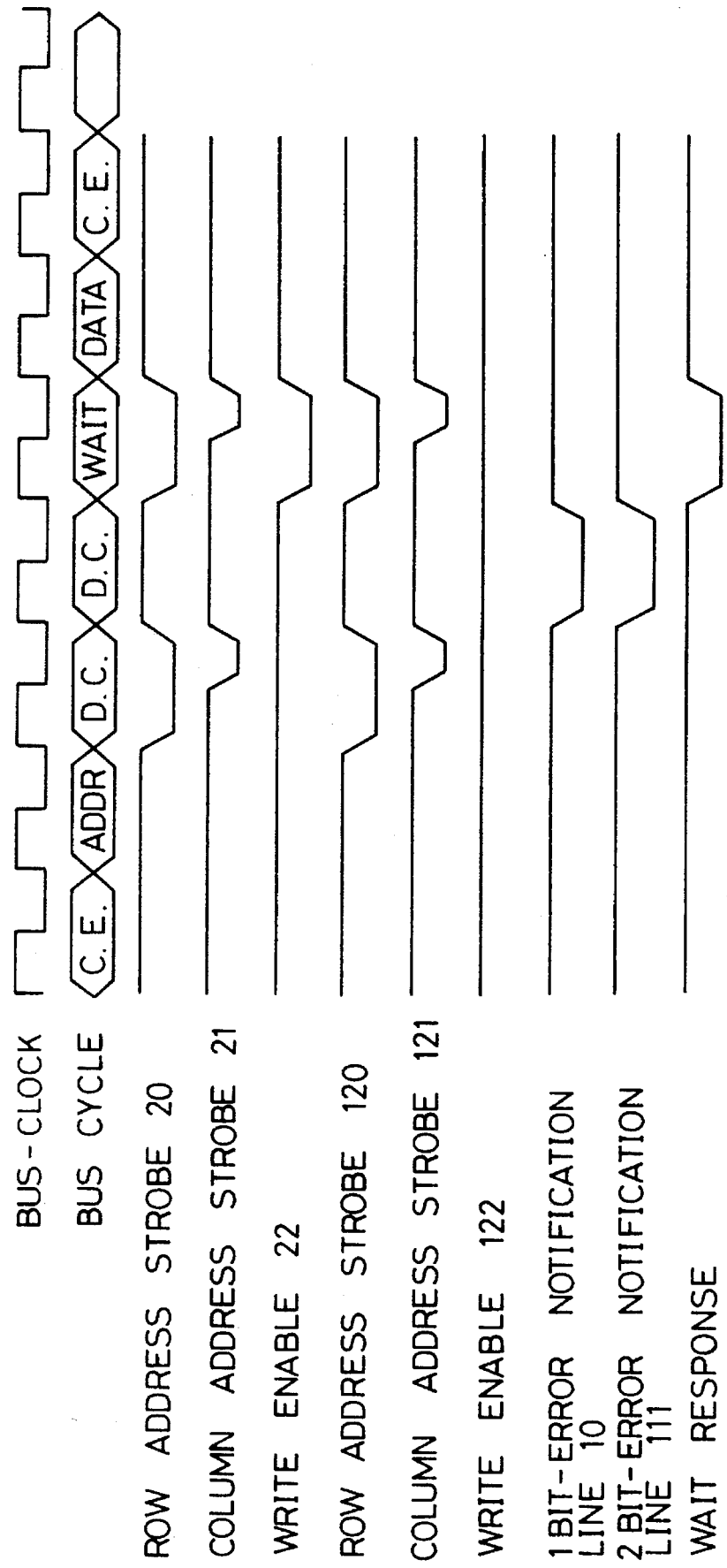
FIG. 6 shows a set of timing diagrams illustrating an operation of a multi-memory apparatus of the invention in FIG. 1 when the master memory detects a one-bit read error and the backup memory coincidentally detects a two-bit read error.

First, operation in the event of a one-bit read error detected during a read operation is now described with reference to FIGS. 1, 4, 5 and 6. FIG. 4 shows a set of timing diagrams illustrating operation of a multi-memory apparatus in FIG. 1 in the event of a one-bit read error detected in the master memory during a read operation. FIG. 5 shows a set of timing diagrams illustrating operation of a multi-memory apparatus in FIG. 1 in the event of a one-bit read error detected in the backup memory. FIG. 6 shows a set of timing diagrams illustrating operation of a multi-memory apparatus in FIG. 1 when the master memory detects a one-bit read error and the backup memory coincidentally detects a two-bit read error.

When a one-bit read error occurs in the midst of reading data from the memory array 8, the memory control circuit 7 detects it. The memory control circuit 7 corrects the error and writes the corrected data back into the memory array 8. The bus control circuit 3 issues a wait response on the system bus 14 to notify the bus master of its delayed response operation. The circuit 7 notifies the partner circuit 107 of the error by way of the one-bit read error notification line 10, in order to prevent the partner memory unit 101 from performing a refresh operation until the master memory is ready for refresh, clearing all the error-related process, lest the system operation should lose full synchronism. When the partner memory control circuit 107 receives the error notification the circuit performs the same operation to that of the memory control unit 7 in parallel.

A theoretical mode-change process in the event of a read error In the master memory is now described with reference to FIGS. 2(b) and 2(c). The master bus-response control circuit 2 issues a "RESPONSE*" signal to the bus control circuit 3 as shown in FIG. 2(b). The master bus control circuit 3 issues a "RESPONSE*" signal for controlling input/output access to the system bus. However once the memory control circuit 7 issues an error signal in the event of a detected read error as shown in FIG. 2(c), the bus-response control circuit 2 issues a "MCHG*" signal to the partner bus-response control circuit 102 by way of the bus response mode-change request line 13. The backup bus-response control circuit 102 then turns memory unit 101 to a master.

The foregoing mode-change operation, however, is not adopted in this embodiment when there is only a one-bit or temporary low-priority error.

When a one-bit read error occurs in the backup memory 101, the memory unit operates in mostly the same way as that in the event of a detected error in the master memory stated earlier. In this case, however, it is not the bus control circuit 103 but the bus control circuit 3 that issues a wait response when the master memory 1 receives an error notification in the memory control circuit 7 by way of the one-bit read error notification line 110 as shown in FIG. 5.

Another operation of a multi-memory apparatus in the event of an error is now described with reference to FIG. 6. When a one-bit read error and a two-bit read error are detected simultaneously in the master and backup memory units, 1 and 101, respectively, a one-bit read error in the master memory is corrected and a corrected data is written back in the same way as stated earlier. The backup memory with a two-bit read error retries a read operation to make it sure that the error is serious or unrecoverable. However, a memory unit with a two-bit read error is likely to have a fault or damage in the memory array and therefore data with a two-bit read error should neither be corrected nor written back into the memory array.

As described above one of the distinctive features of a multi-memory apparatus of the invention throughout the embodiments lies in synchronous refresh operation among memory units in the apparatus. Another distinctive feature of the invention lies in the bus-response operation performed only by the master memory unit. Another distinctive feature of the invention lies in the bus-response mode-change operation in the event of a detected error.

A multi-memory apparatus of the invention is, as stated earlier, configured with two or more identical memory units involving the following functional elements:

(a) a refresh request circuit which issues a refresh request using bus clock with the master memory and by a trigger from the master memory with the backup memory; and, (b) a bus control circuit which allows access for response to the system bus only with the master memory.

This contributes to some configurative advantages of a multi-memory apparatus: a multi-memory apparatus configurated in this manner requires no such additional external circuits for comparison or selection as those employed in the background art. One of the features of the invention lies in the system configuration required just two or more identical memory units with access to the common standard system bus.

Figure 7:
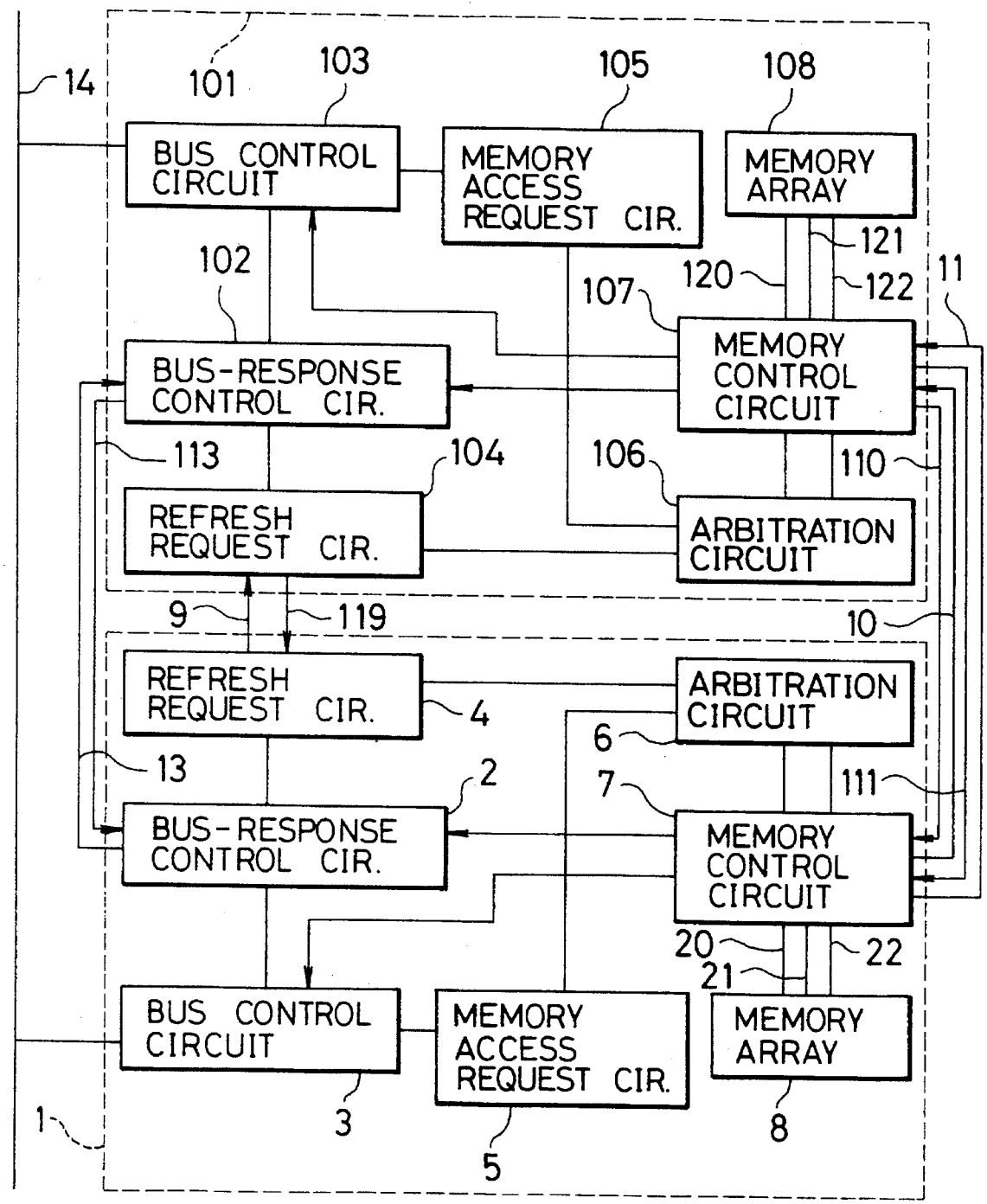
FIG. 7 shows a configuration of a multi-memory apparatus according to another embodiment of the invention.

FIG. 7 shows a configuration of a multi-memory apparatus according to another embodiment of the invention. The embodiment provides an error status indicator for replacement of a failing memory unit in the event of a two-bit or serious error. FIG. 7 comprises FIG. 1, as modified by adding two-bit read error notification lines 11 and 111. The memory control circuit connected with the notification lines has a memory error status register which notifies the partner register of a detected two-bit read error and receives the error notification from the partner unit. The bus-response control circuit has an error flag register which indicates and holds error status of a memory unit. A simple flipflop configuration can be adopted for an error flag register, which indicates the occurrence of error and holds the error status thereafter. A memory unit indicating error status with the error flag register waits for replacement by a periodical hardware check by the bus master.

Operation of a multi-memory apparatus of the invention in the event of a two-bit read error detected during a read operation is now described with reference to FIGS. 8 and 9. FIG. 8 shows a set of timing diagrams illustrating operation of a multi-memory apparatus in FIG. 1 in the event of a two-bit read error detected in the master memory. FIG. 9 shows a set of timing diagrams illustrating operation of a multi-memory apparatus in FIG. 1 in the event of a two-bit read error detected only in the backup memory.

When a two-bit read error, shown as "TWO-BIT ERROR*" in FIG. 2(c), is detected only in the master memory 1 during a read operation the memory control circuit 7 by way of the bus control circuit 3 and the system bus 14 notifies the bus master of the error. The "ERROR" signal on the bus cycle in FIG. 8 indicates a two-bit read error on the two-bit read error notification line 11. With the error notification the bus master acknowledges the error in the master memory and executes a command of another read operation. In the meantime, the bus-response control circuit 2 receives a request for mode-change from the memory control circuit 7 and issues a mode-change request to the partner backup memory by way of the bus response mode-change request line 13. With the request, the backup memory 101 turns master and the master memory 1 turns backup. The bus-response control circuit 2 sets an error flag register to indicate and hold the error status of the memory unit.

When a two-bit read error is detected only in the backup memory 101 the unit neither goes into mode-change operation using the bus response mode-change request line 113 nor notifies the bus master of the error requesting another read operation. The memory control circuit 107 sets and holds an error flag register.

When two-bit read errors are detected both in the master and backup memory units coincidentally the system operation is the same as that in the event of the error detected only in the master memory.

As described above, a distinctive feature of a multi-memory apparatus of the invention according to this embodiment lies in the bus-response control circuit which indicates only serious errors in the event of a detected error and which performs a mode-change operation with the master memory and neglects a mode-change operation with the backup memory In the event of a serious detected error.

Figure 10A:
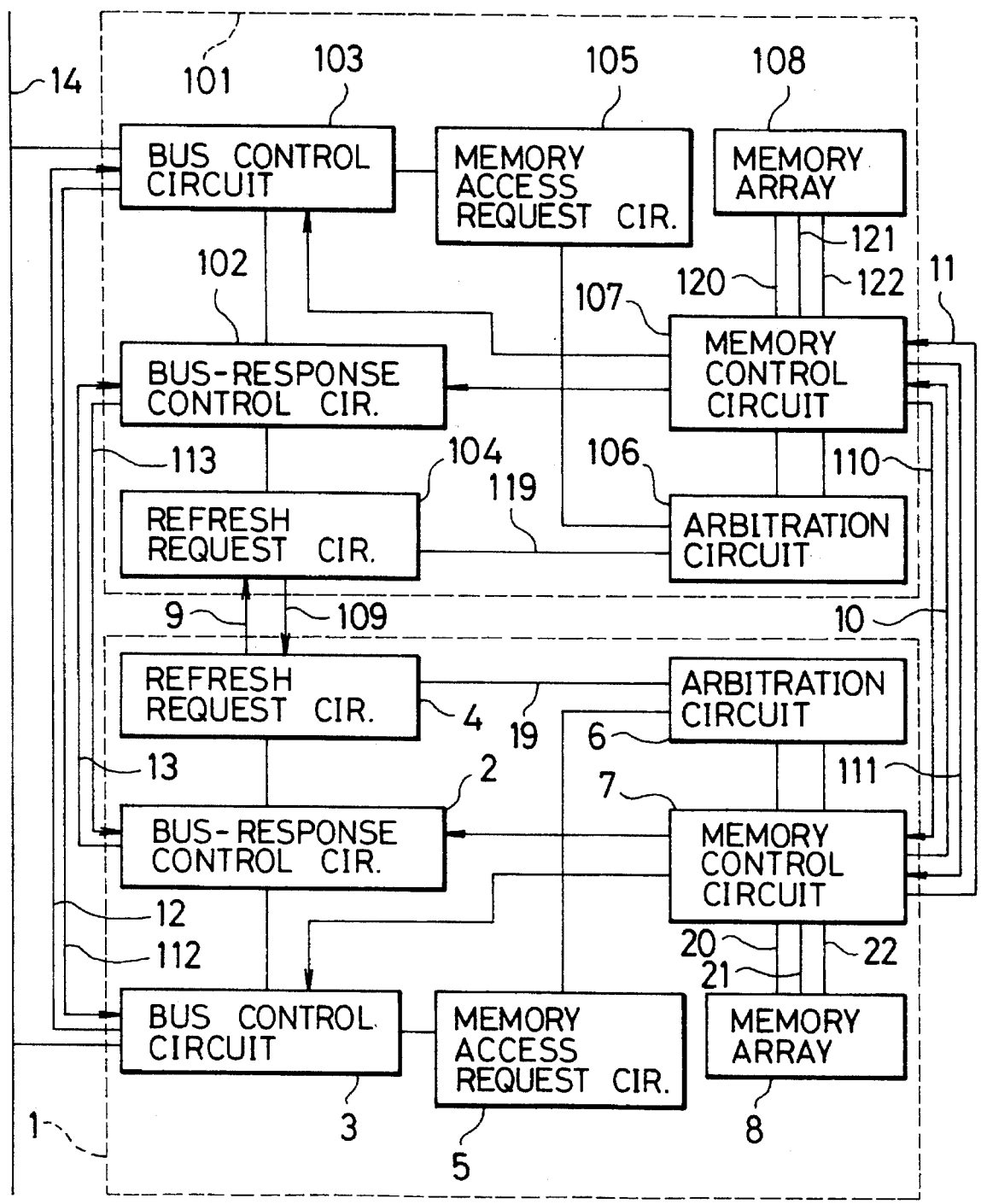
FIG. 10(a) shows a configuration of a multi-memory apparatus of the invention according to another embodiment of the invention.
Figure 10B:
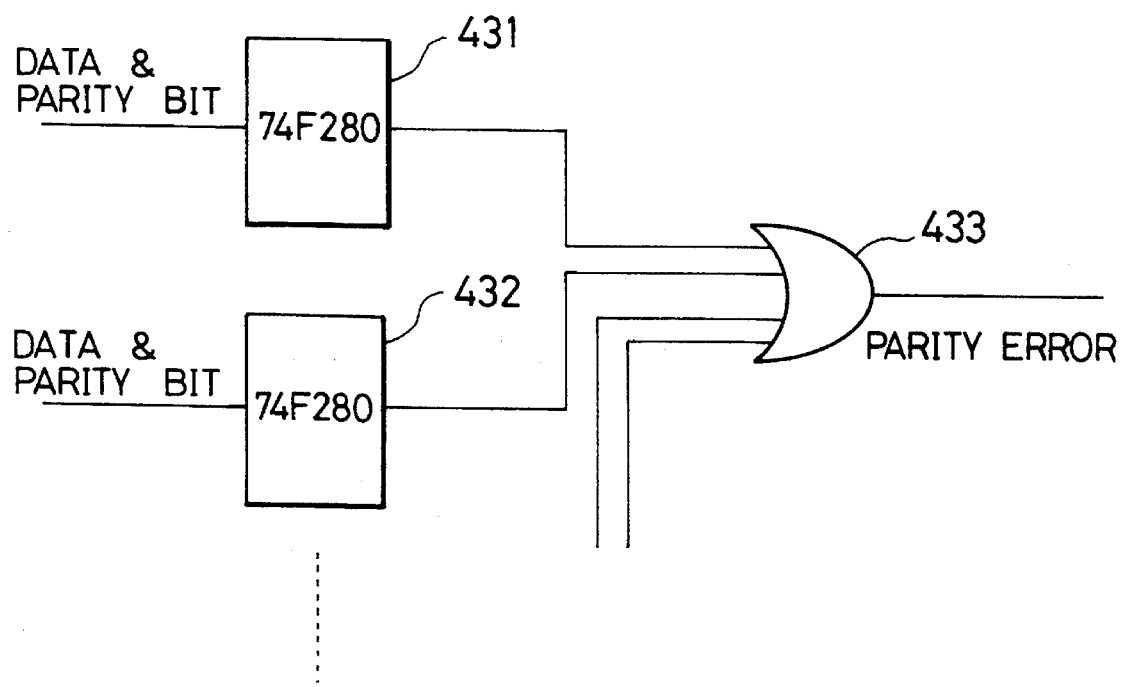
FIG. 10(b) shows a bus-parity check circuit in the bus control circuit of a multi-memory apparatus of the invention in FIG. 10(a)
Figure 10C:
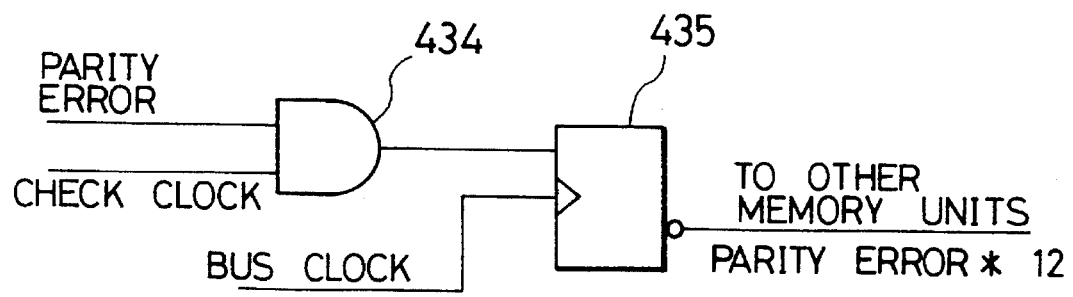
FIG. 10(c) shows a bus-parity error notification circuit in the bus control circuit in FIG. 10(a)
Figure 10D:
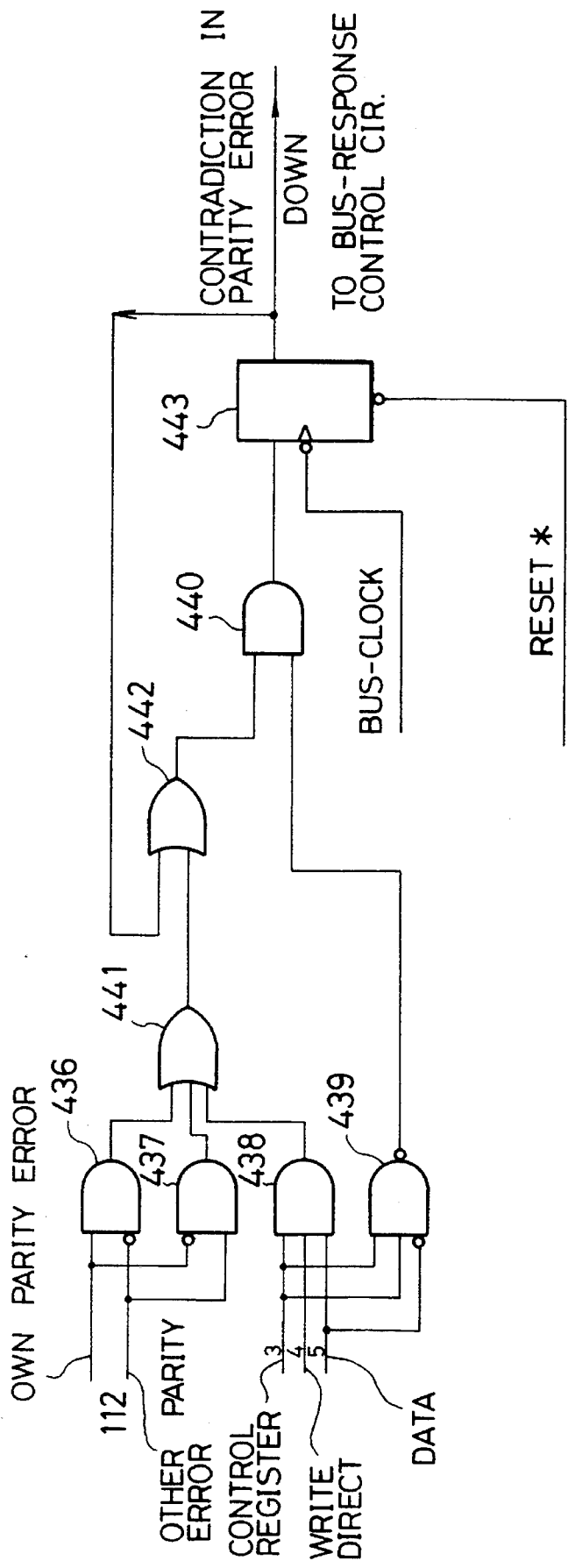
FIG. 10(d) shows a comparison circuit for checking bus-parity errors In its own bus control circuit and others in FIG. 10(a)

FIG. 10(a) shows a configuration of a multi-memory apparatus according to another embodiment of the invention. Errors occur mainly in the memory array, as mentioned earlier, and in transferring data on the system bus in a multi-memory apparatus. This embodiment deals with the operation of a multi-memory apparatus in the event an error occurs in transferring data on the system bus. FIG. 7, with bus-parity error detection lines 12 and 112 appended, forms FIG. 10(a). Each of the bus control circuits 3 and 103, connected with the bus-parity error detection notification lines, has a bus-parity check register (bus-parity error detect means). The bus-parity check registers inform each other of their own bus-parity check results for comparison. FIG. 10(b) shows a bus-parity check circuit in the bus control circuit in FIG. 10(a). The bus-parity check circuit comprises two (or more) 74F280 nine-bit bus-parity checkers (or four of them with 32-bit-one-word), 431 and 432, and an OR gate 433. FIG. 10(c) shows a bus-parity error notification circuit in the bus control circuit in FIG. 10(a). The bus-parity error notification circuit comprises an AND gate 434 and a flipflop 435. FIG. 10(d) shows a comparison circuit in the bus control circuit in FIG. 10(a) for comparing bus-parity check results between memory units and holding disparity data if any. The comparison circuit comprises logic elements 436 through 442 and a flipflop 443 for holding the disparity data.

Operation of a multi-memory apparatus in the event of a detected bus-parity error is now described in reference to FIGS. 10(a) through 11. FIG. 11 shows a set of timing diagrams illustrating operation of a multi-memory apparatus in the event of a bus-parity error detected in the master memory.

When a bus-parity error is detected only in the master memory the bus control circuit 3 by way of the system bus 14 notifies the bus master, an external unit, of the detected error. The bus control circuit 3 at the same time drives the memory control circuit to stop writing data into the memory array 8. The bus master, with the error notification, executes another command for a write operation. The bus control circuit 3 notifies the partner bus control circuit 103 of the detected error by way of the bus-parity detection notification line 12 as shown in FIG. 11. At the same time the bus control circuit 3 acknowledges the bus-parity check result in the partner circuit by way of the bus-parity detection notification line 112. The bus control circuits 3 and 103 actually compare with each other the numerical values of the bus-parity check result on the notification lines with their own values. When the bus control circuit 3 finds a difference between the values as a result of the comparison, the circuit notifies the bus-response control circuit 2 of the error. With the error notification, the bus-response control circuit 2 sets an error flag register and performs a mode-change operation between the memory units by way of the bus response mode-change request line 13. The partner backup memory 101 then turns master and the master memory 1 turns backup.

When a bus-parity error is detected only in the backup memory 101, the bus control circuit 103 drives the memory control circuit 107 to stop writing data into the memory array 108. The bus-response control circuit 102 sets an error flag register and holds the error status of the backup memory. In this case, there is neither mode-change nor notification of detected bus-parity error on the system bus 14.

When bus-parity errors are detected both in the master and backup memory units coincidentally they both notify the bus master of the detected errors and also stop writing data into their memory arrays. The master memory in this case maintains its mode without setting an error flag register in the bus-response control circuit 2.

As described above, a distinctive feature of a multi-memory apparatus of the invention, according to this embodiment, lies in operation of a memory unit which compares its own bus-parity check result with those of others in the event of a detected bus-parity error. When the bus-parity check results differ, the memory unit acknowledges its error status. The master memory in this situation changes to a backup mode. This contributes to high reliability of a multi-memory apparatus.

Figure 12:
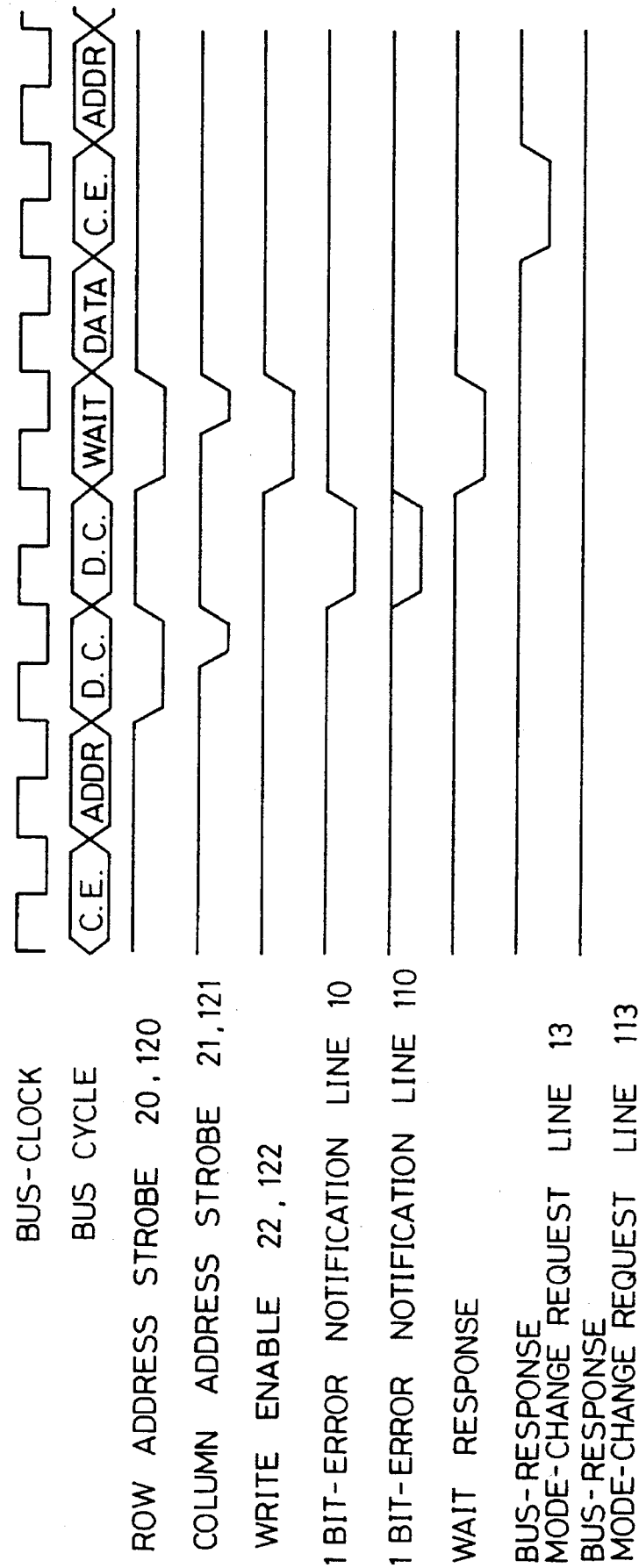
FIG. 12 shows a set of timing diagrams illustrating an operation of a multi-memory apparatus of the invention in the event of one-bit read error detected in the master memory.

Operation of a multi-memory apparatus according to another embodiment of the invention In the event of a one-bit read error Is now described with reference to FIGS. 1 and 12. As stated earlier with respect to a previous embodiment, the master memory does not perform a mode-change operation in the event of a one-bit or temporary error. The present embodiment deals with a different performance, namely where the master memory changes to a backup mode in that situation. FIG. 12 shows a set of timing diagrams illustrating operation of a multi-memory apparatus in the event of a one-bit read error detected in the master memory.

When a one-bit read error occurs only in the master memory during a read operation, the memory control circuit 7 detects the error and informs the bus control circuit of the error as shown in FIG. 2(b). The master memory performs a mode-change operation as shown in FIG. 12 by way of the bus response mode-change request line 13. The partner backup memory turns master and the master memory turns backup. The memory control circuit 7 corrects the error and writes the corrected data back into the memory array 8.

When a one-bit read error is detected only in the backup memory during a read operation the memory control circuit 107 performs the same correct and rewrite operation of error data. There is no mode change between the memory units in this case.

When one-bit read errors occur in both the master and backup memory units coincidentally, the same operation can be applied to this case as that in the event of an error detected only in the master memory stated above.

Another embodiment of the invention concerning a two-bit read error that occurs in a read-modify-write operation may be described with reference to FIGS. 7 and 13. This embodiment, involving a read-modify-write operation, features a distinctive write operation in the backup memory in the event of an error. FIG. 13 shows a set of timing diagrams illustrating operation of a multi-memory apparatus of the invention In the event of a two-bit read error detected in the master memory in the midst of a read-modify-write operation.

It is generally impossible to specify the error bit in the event of a two-bit read error during a read-modify-write operation. In this case, the memory control circuit 7 stops a write operation into the memory array.

When a two-bit read error occurs only in the master memory 1 in a read-modify-write operation the bus control circuit 3 notifies the bus master of its failing read-modify-write operation by way of the system bus 14. The bus master, with the error notification, executes a command of another read-modify-write operation on the next cycle. The master memory performs a mode-change operation by way of the bus response mode-change request line 13. Specifically, the partner backup memory turns master and the master memory turns backup. The memory control circuit 7 stops a write operation and notifies the partner backup memory control circuit 107 of the detected error. The circuit 107 with the error notification stops a write operation into the memory array 108 to secure the original data.

When a two-bit read error occurs only in the backup memory the unit stops a write operation. The master memory, on the other hand, continues a normal read-modify-write operation. There is no mode change between the memory units.

When two-bit read errors occur both in the master and backup memory units the same operation is applied to this situation as that In the event of an error detected only in the master memory stated above.

As described above, a distinctive feature of a multi-memory apparatus of the invention according to this embodiment lies in operation of the backup memory which stops a write operation and waits for another read operation or retry in the event of a serious error detected in the master memory. This contributes to high reliability of a multi-memory apparatus.

Figure 14A:
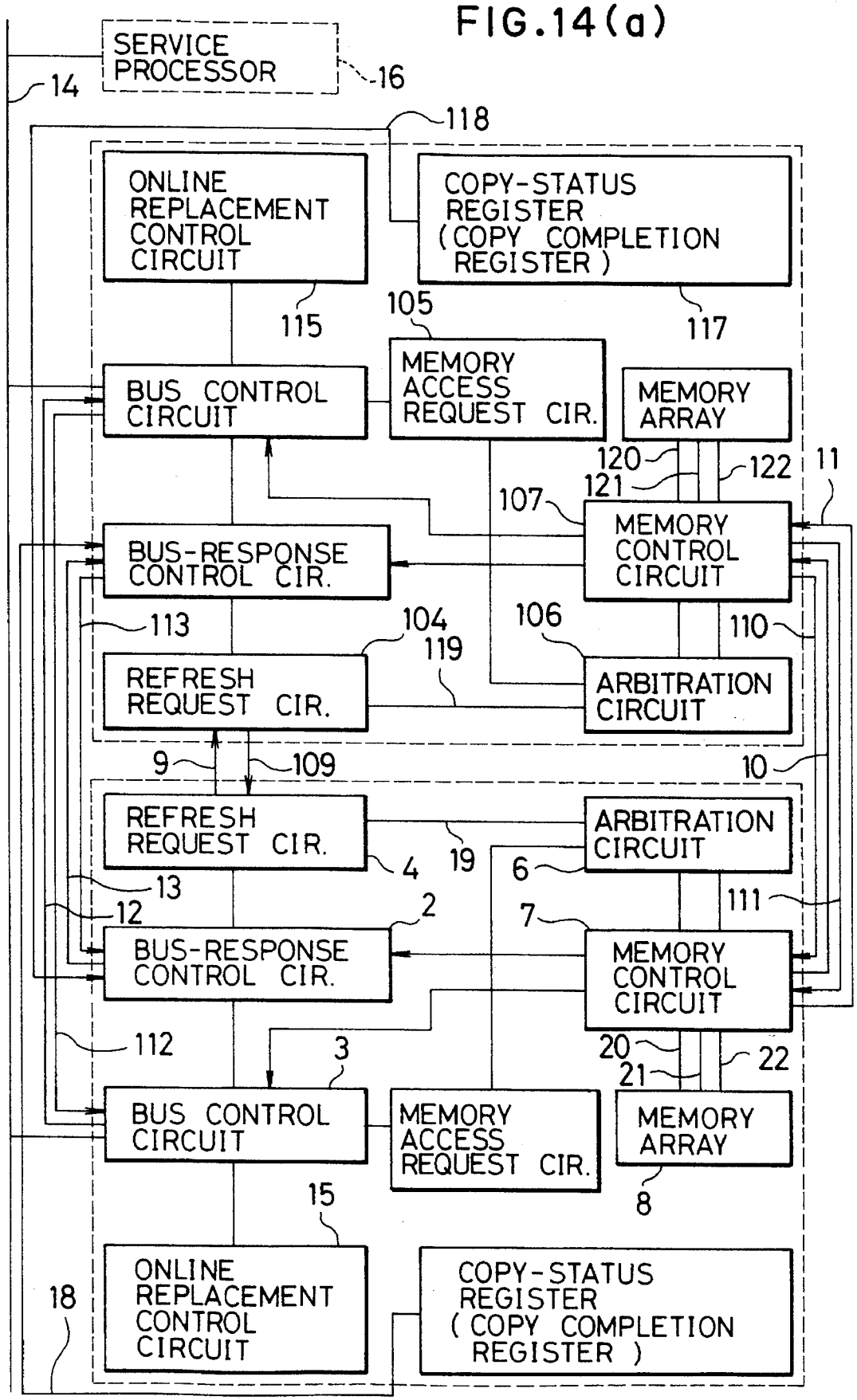
FIG. 14(a) shows a configuration of a multi-memory apparatus of the invention, providing an initializer according to another embodiment of the invention.
Figure 14B:
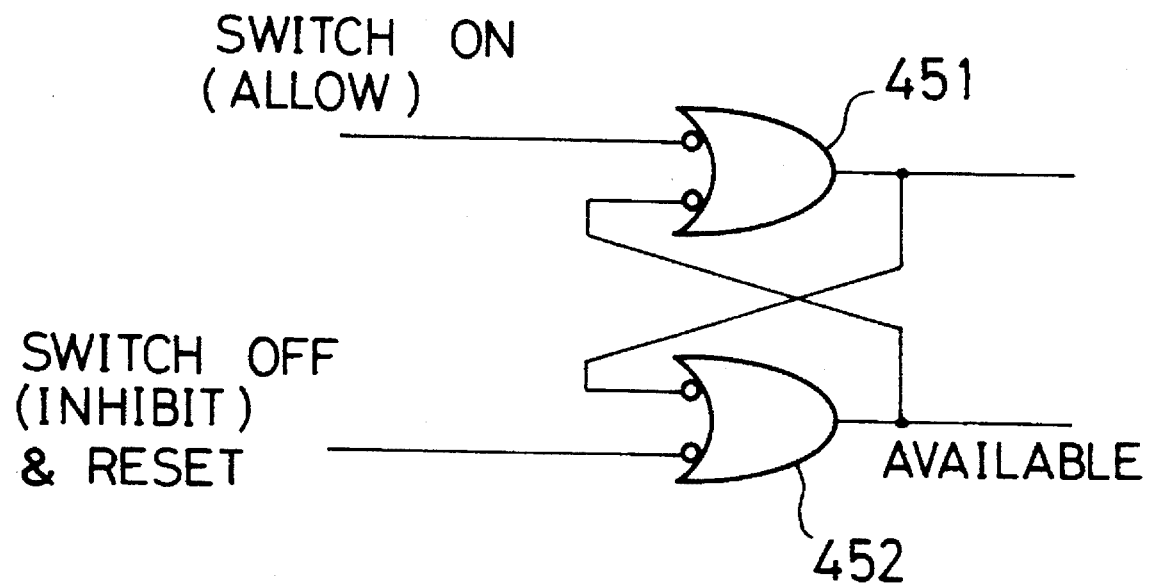
FIG. 14(b) shows the online replacement control circuit in FIG. 14(a)

FIG. 14(a) shows a configuration of a multi-memory apparatus providing an initializer according to another embodiment of the invention. FIG. 7, with online replacement control circuits 15 and 115, a service processor 16 for testing and copying memory data, copy status registers 17 and 117, and copy completion notification lines 18 and 118 appended, forms FIG. 14(a). The copy status register may adopt a simple flipflop configuration and will stop a mode-change operation during the initial memory data copy operation in a replaced new memory unit. FIG. 14(b) shows the logic online replacement control circuit 15 in FIG. 14 (a). The online replacement control circuit, adopting a simple flipflop configuration, depends upon operator's switch-control for online replacement of a memory unit.

Figure 15:
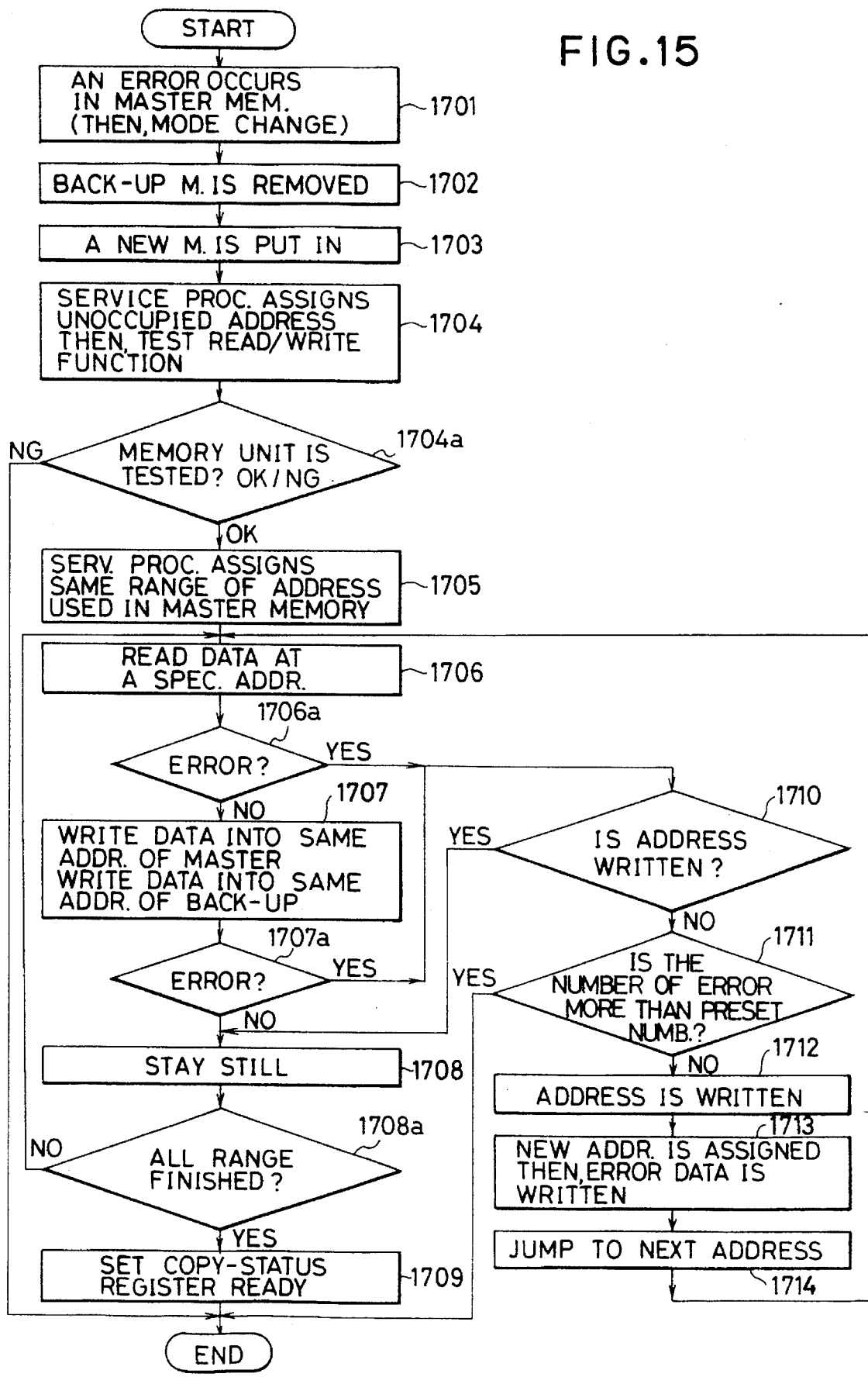

Operating sequences of online replacement of a memory unit in the event of an error is now described with reference to FIGS. 14(a) and 15. FIG. 15 shows a flow chart illustrating the operating sequences.

The following is the operating sequences of online replacement of a memory unit in the event an error occurs in the master memory.

Step 1701. A mode-change operation is performed between the master and backup memory units: the master memory turns backup and a partner backup memory turns master. There is no mode change, however, when an error occurs in a backup memory.

Steps 1702. and 1703. The damaged memory unit with error is removed and replaced with a new memory unit in the midst of the operation by using the online replacement controller 15 in FIG. 14(a). The execution of the replacement requires a manual operation by an operator who periodically checks the state of the error flag register. The replacement is actually processed in the following order. An operator drives the bus control circuit of the damaged unit to stop access to the system bus 14 by the switch-control in the online replacement control circuit. The damaged unit is removed from the system. A new memory unit is replaced instead under the same access condition to the system bus in the bus control circuit as that of the removed damaged unit. An operator then drives the bus control circuit of the replaced new unit to allow access to the system bus. The replaced new unit is then initialized as a backup memory by Copying memory data. The service processor 16 sets the copy completion register 17 not-ready for the initial backup copy.

Step 1704. The service processor 16 assigns an unoccupied addressed area in the memory array of the replaced new backup unit for an initial diagnostic function test. The processor tests a read/write function as well as error detection function of the new memory unit.

Step 1704(a). A check is made of whether the test has occurred and was successful (OK/NG). If there has been no test (NG), the process ends. If there has been a test, processing proceeds to Step 1705.

Step 1705. When the test detects no functional trouble in the replaced new unit, the addressed area is saved for the initial backup copy.

Steps 1706 and 1707 describe a read/write operation of the initial backup copy. The service processor 16 executes a series of read and write operation in an uninterrupted way for each data one after another.

Step 1706. All the memory data is read out from the master memory array.

Step 1706(*a*). A check is made of whether a read error has occurred in the readout data. If there has been no read error, processing proceeds to Step 1707. If there has been a read error, processing proceeds to Step 1710.

Step 1707. The readout data is written back into the same address of the master memory and also the data is written into the same address of the replaced new backup memory array.

Step 1707(*a*). A check is made of whether a write error has occurred in the written data. If there has been no write error, processing proceeds to Step 1708. If there has been a write error, processing proceeds to Step 1710.

Step 1708. There is a certain stay-still period or interval provided between the read/write operation in Steps 1706 and 1707 for another operation by the bus master.

Step 1708(*a*). A check is made of whether the read/write operation has been completed. If it has been completed, processing proceeds to Step 1709. If it has not been completed, processing continues the read/write operation in Steps 1706 through 1708.

Step 1709. When the initial copy operation is completed the service processor 16 sets the backup copy-status register 17 "ready" to notify the master bus-response control circuit of the completion of the initial copy by way of the copy completion notification line 18. The copy-status register 17 will prevent a mode-change operation by the master bus-response control circuit in the event of an error with a "not-ready" signal during a copy operation.

In order to acquire a correct duplicate data by the initial copy operation, data with a detected two-bit read/write error should be eliminated. Steps 1710 through 1714 describe an operation performed in the memory array in the event of a detected two-bit read/write error in the master memory or backup memory in Step 1706(*a*) or 1707(*a*).

Step 1710. A check is made of whether the address of a two-bit error data has already been registered as an error data in Step 1710. When not registered, proceed to Step 1711; when registered, Step 1713 should be skipped and proceed to Step 1708.

Step 1711. A check is made of whether the error is more than a predetermined amount. If it is more, then the process proceeds to Step 1712. If it is not more, the initial copy operation is discontinued with a memory unit which has stored a certain amount of error data registered in Step 1712.

Step 1712. When a two-bit read/write error is detected in Step 1706(*a*) or 1707(*a*) the error address is registered in the service processor as an error data.

Step 1713. The error data in Step 1710 is temporarily stored as a two-bit error to indicate error in an empty addressed decode area. The temporary address is assigned in the relative addressed location in the backup memory array to that of the original error data in the master memory array.

Step 1714. The initial copy operation resumes after the two-bit read/write error related operation.

As described above, a distinctive feature of a multi-memory apparatus of the invention according to this embodiment lies in providing a copy completion register which restricts a bus-response mode-change operation in the master memory during the initial copy operation of a replaced new memory unit online. This contributes to high reliability of a multi-memory apparatus.

Figure 16:
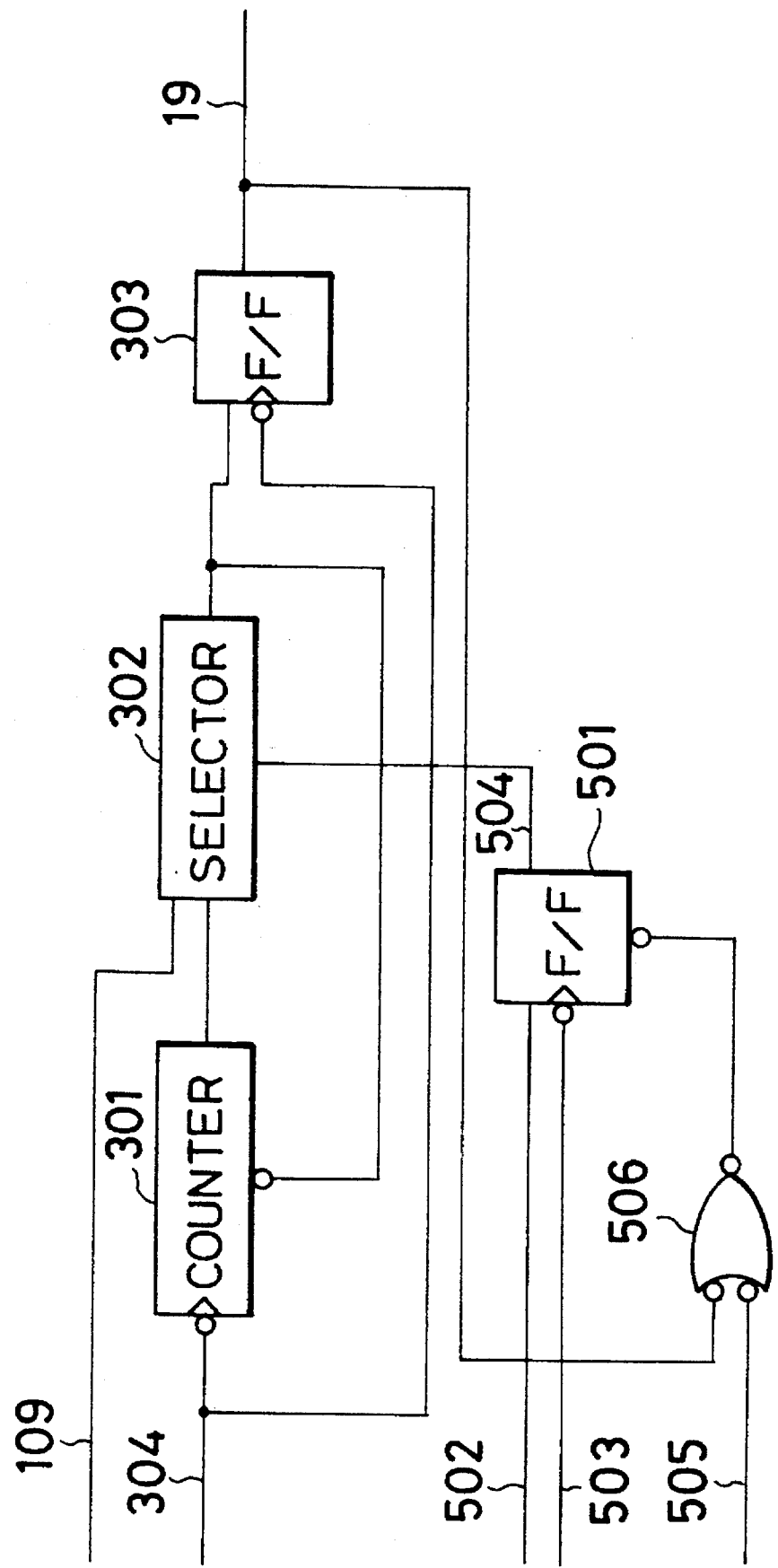
FIG. 16 shows a refresh request circuit in the refresh request control circuit in FIG. 1 according to another embodiment.

FIG. 16 shows another example of refresh request circuit of a multi-memory apparatus according to another embodiment of the invention. This embodiment provides another type of refresh request circuit dealing with fault-tolerant operation for refresh request. The refresh request circuit according to this embodiment involves an additional circuit which decides a refresh request timing when the backup refresh request circuit receives no refresh request trigger from the master memory. The refresh request circuit in FIG. 16, based on the refresh request circuit in FIG. 2, includes a flipflop 501, a data line 502, a bus request not-ready set line 503, a selector control line 504, a reset line 505, and a NOR gate 506.

Figure 17:
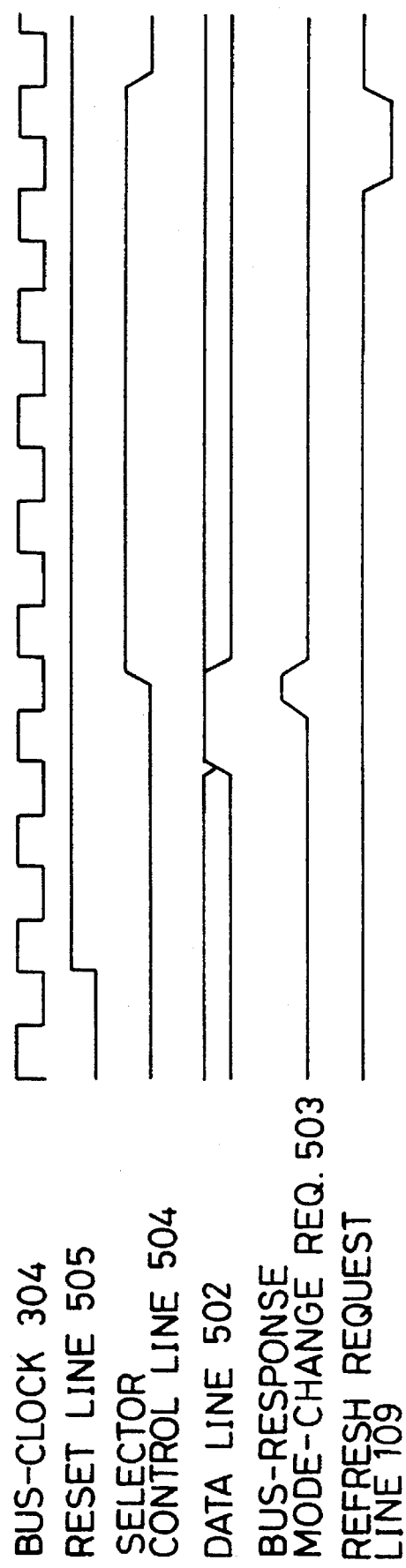
FIG. 17 shows a set of timing diagrams illustrating a refresh operation in the refresh request circuit in FIG. 16.

Improved operation of the refresh request circuit with an additional function for synchronous operation is now described with reference to FIGS. 1, 16 and 17. The refresh request circuit according to this embodiment usually operates on its own using the bus clock except when the counter is reset at the turn of mode into backup for synchronous operation. FIG. 17 shows a set of timing diagrams illustrating the operation.

When power is on a reset signal on the reset line 505 resets the flipflop 501 issuing a low signal on the selector control line 504. The data line 502 as well as the bus-response control notification line 503 carries a high signal temporarily when the master memory turns backup. The selector 302 selects an input from the refresh request notification line 109 when the selector control line 504 has a high signal. When the master memory turns backup a signal on the selector control line 504 becomes high as a result of signals high on the data line 502 and the bus-response control notification line 503 as shown in FIG. 17. When a signal on the refresh request notification line 109 becomes low informing of the issue of a refresh request in the partner memory unit, the counter 301 is reset to have the same numerical value as that of the partner counter in the master memory to have a synchronous operation between them. When a signal on the refresh request line 19 consequently becomes low the flipflop 501 is reset through the NOR gate 506 to issue a low signal on the selector control line 504 becomes low. Accordingly, the selector 302 selects an input from the counter 301.

Now that the counters 301 in the master memory and 1301 in the backup memory have numerical values in common the master and backup memory units issue refresh requests simultaneously. This contributes to maintain a synchronous operation between the memory units.

Figure 18:
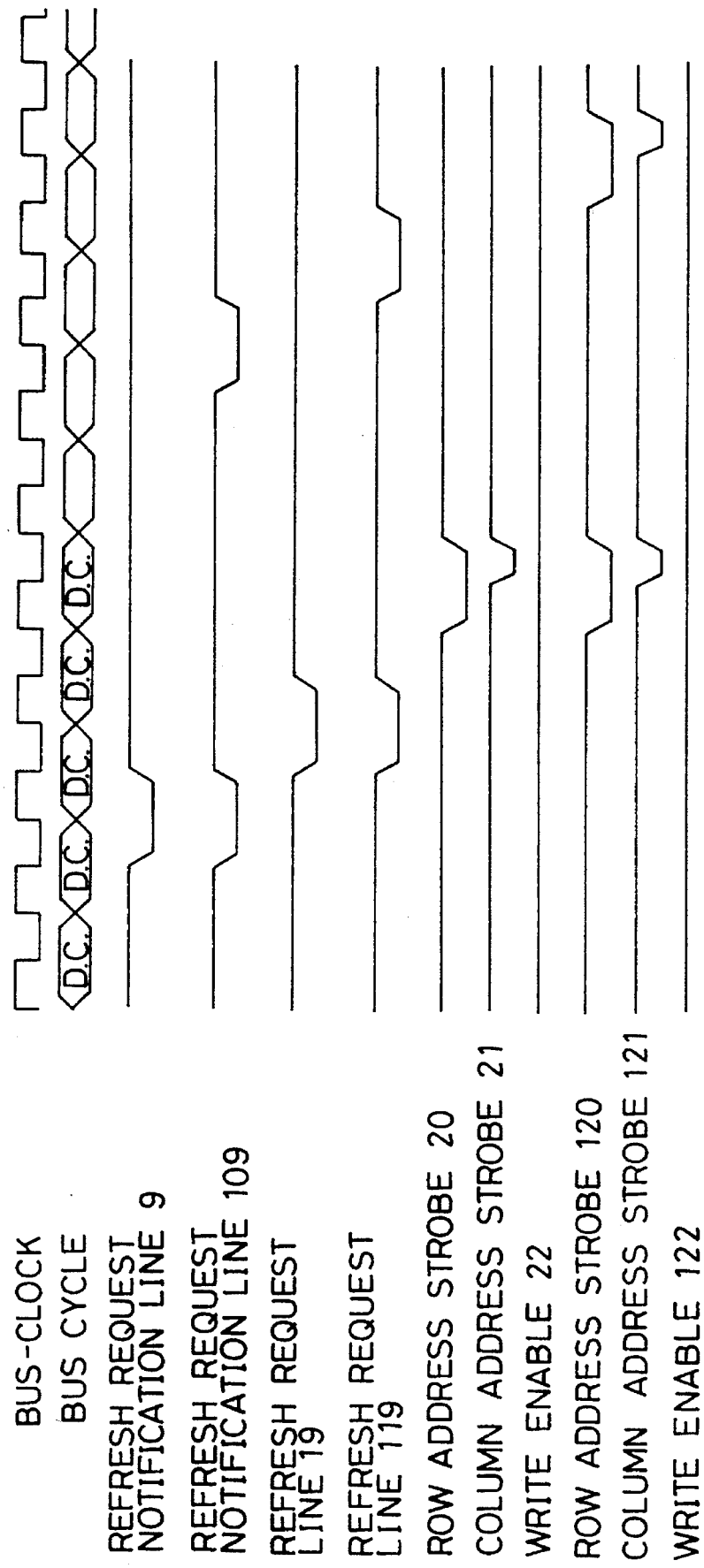
FIG. 18 shows a set of timing diagrams illustrating an operation of a multi-memory apparatus of the invention in the event of a failure occurring in the refresh request circuit in the master memory.
Figure 19:
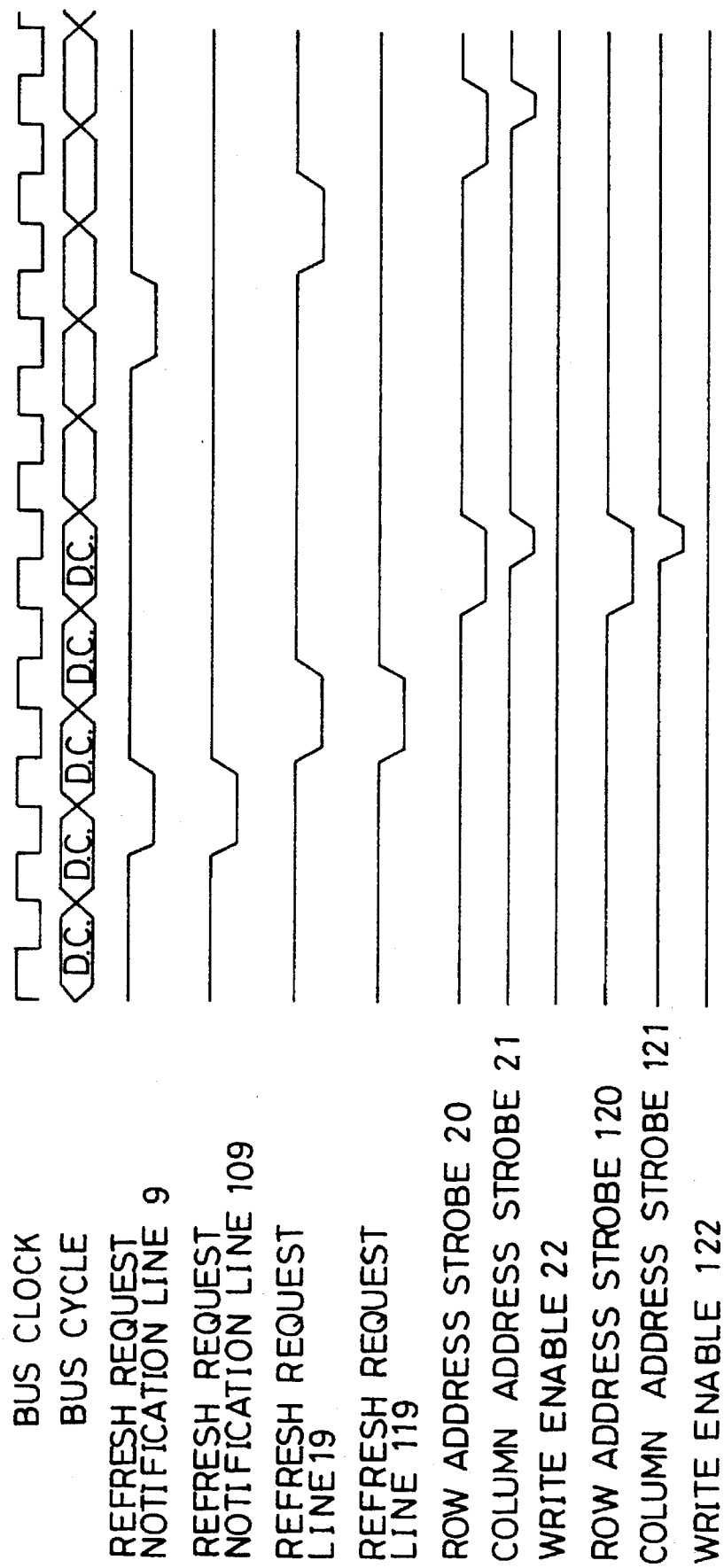
FIG. 19 shows a set of timing diagrams illustrating an operation of a multi-memory apparatus of the invention in the event of a failure occurred in the refresh request circuit in the backup memory.

Operation of a multi-memory apparatus in the event of a refresh request trouble occurred in the refresh request circuit is now described with reference to FIGS. 1, 16, 18 and 19. FIGS. 18 and 19 show sets of timing diagrams illustrating operation of a multi-memory apparatus in the event of a refresh request failure in the master and backup refresh request circuits, caused by some trouble in the circuits respectively.

The refresh request circuits monitor and compare the values on the lines to each other in order to maintain a synchronous refresh operation between the memory units. When the master refresh request circuit fails to issue a request, the partner backup refresh request circuit acknowledges the failure by the difference between the numerical values on the refresh request notification lines 9 and 109. The backup refresh request circuit then notifies the bus-response control circuits 2 and 102 of the failure. The bus-response control circuit 2 with the notification performs a mode-change operation: the backup memory turns master and the master memory turns backup. The bus-response control circuits 2 and 102 then freeze a mode-change operation between the memory units by way of the bus response mode-change request lines 13 and 113 until the damaged memory unit with the refresh request failure is replaced with a new unit.

When the backup refresh request circuit fails to issue a request the master and backup refresh request circuits acknowledge the failure by the difference between the numerical values on the refresh request notification lines 9 and 109. The circuits then notify the bus-response control circuits 2 and 102 of the failure respectively. With the notification the bus-response control circuits freeze a mode-change operation between the memory units by way of the bus response mode-change request lines 13 and 113. The damaged backup memory unit with the refresh request failure is removed out of the system.

As described above, a distinctive feature of a multi-memory apparatus of the invention according to this embodiment lies in much higher reliability of synchronous refresh operation in the system.

A mode-change operation has been introduced in the foregoing embodiments performed immediately after the event of a detected serious error in the master memory.

Another embodiment of the invention provides an error counter which notifies error status of a unit when a temporary error is detected frequently. The error counter registers each error occurred in a memory unit. The counter can indicate the time for replacement of a damaged unit by a certain number of error Frequency imposed in advance in the counter. In other words, a memory unit with only a few temporary errors is allowed to operate in the system.

Another embodiment of the invention introduces operation of a multi-memory apparatus in the event of a two-bit read/write error detected during a read operation ill a memory unit. In the foregoing embodiments, the bus master, an external unit, issues a command of another read/write or retry operation when a two-bit or serious error is detected in the master memory. In this embodiment, however, the memory units perform a mode-change operation between them immediately after a two-bit error detected in the master memory and the master memory turns backup. Accordingly, the master bus-response control circuit, turning backup, issues a bus-response wait request on the system bus. The partner backup memory control circuit consequently turns master and transfers correct memory read data on the system bus. There is, therefore, no read/write or retry operation involving the bus master in this embodiment.

Figure 20:
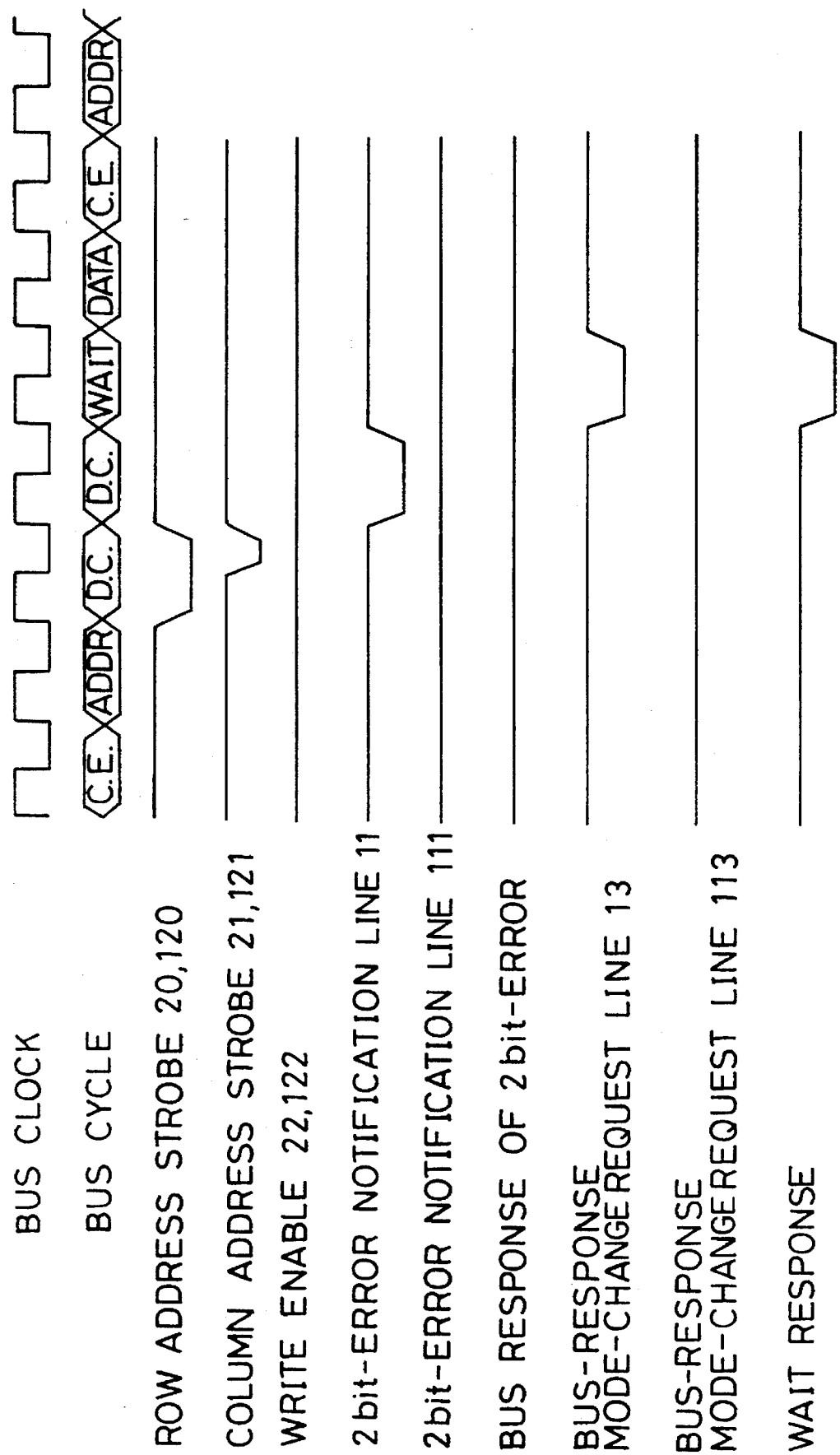
FIG. 20 shows a set of timing diagrams illustrating an operation of a multi-memory apparatus of the invention in the event of/a two-bit error detected during a read operation.
Figure 21:
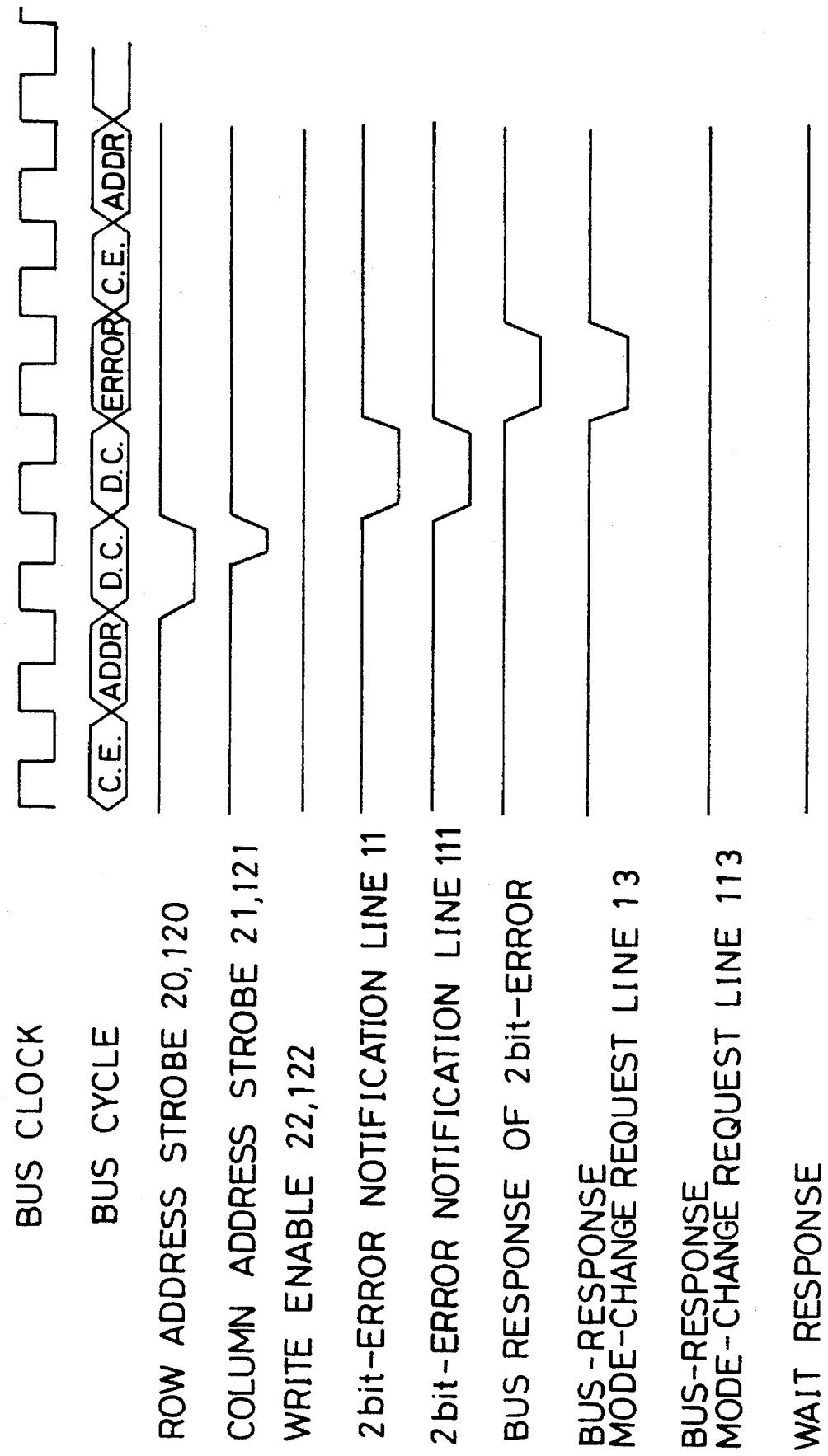
FIG. 21 shows a set of timing diagrams illustrating an operation of a multi-memory apparatus of the invention In the event of two-bit read errors detected coincidentally in the master and backup memory units during a read operation.

Detailed description of the embodiment is now introduced with reference to FIGS. 10, 20 and 21. FIG. 20 shows a set of timing diagrams illustrating operation of a multi-memory apparatus in the event of a two-bit error detected in the master memory during a read operation. FIG. 21 shows a set of timing diagrams illustrating operation of a multi-memory apparatus in the event of two-bit read errors detected in the master and backup memory units.

When the master memory detects a two-bit error during a read operation as shown in FIG. 20, the memory control circuit 7 notifies the partner backup memory control circuit 107 of the error by way of the two-bit read error notification line 11. The control circuit 107 notifies the memory control circuit 7 of no two-bit read error detected in it in return by way of the two-bit read error notification line 111. The master memory control circuit 7 drives the bus-response control circuit to issue a bus response mode-change request on the bus response mode-change request line to turn backup. The circuit 7 also issues a bus-response wait request to notify the bus master of a delayed bus-response caused by the bus response mode-change operation. When the backup memory acknowledges the notification on the bus response mode-change request line 13 it turns master and outputs its readout memory data onto the system bus.

When two-bit read errors are detected in the master and backup memory units as shown in FIG. 21, the memory control circuits 7 and 107 notify each other of the errors and acknowledge them simultaneously by way of the two-bit read error notification lines 11 and 111. The memory control circuit 7 notifies the bus control circuit 3 of the error. The bus control circuit 3 notifies the bus master of the error. The bus-response control circuit 2 performs a mode-change operation to turn backup by way of the bus response mode-change request line 13. In the meantime the bus control circuit 103 receives the error notification from the memory control circuit 107 and stops a response operation onto the system bus.

Figure 22:
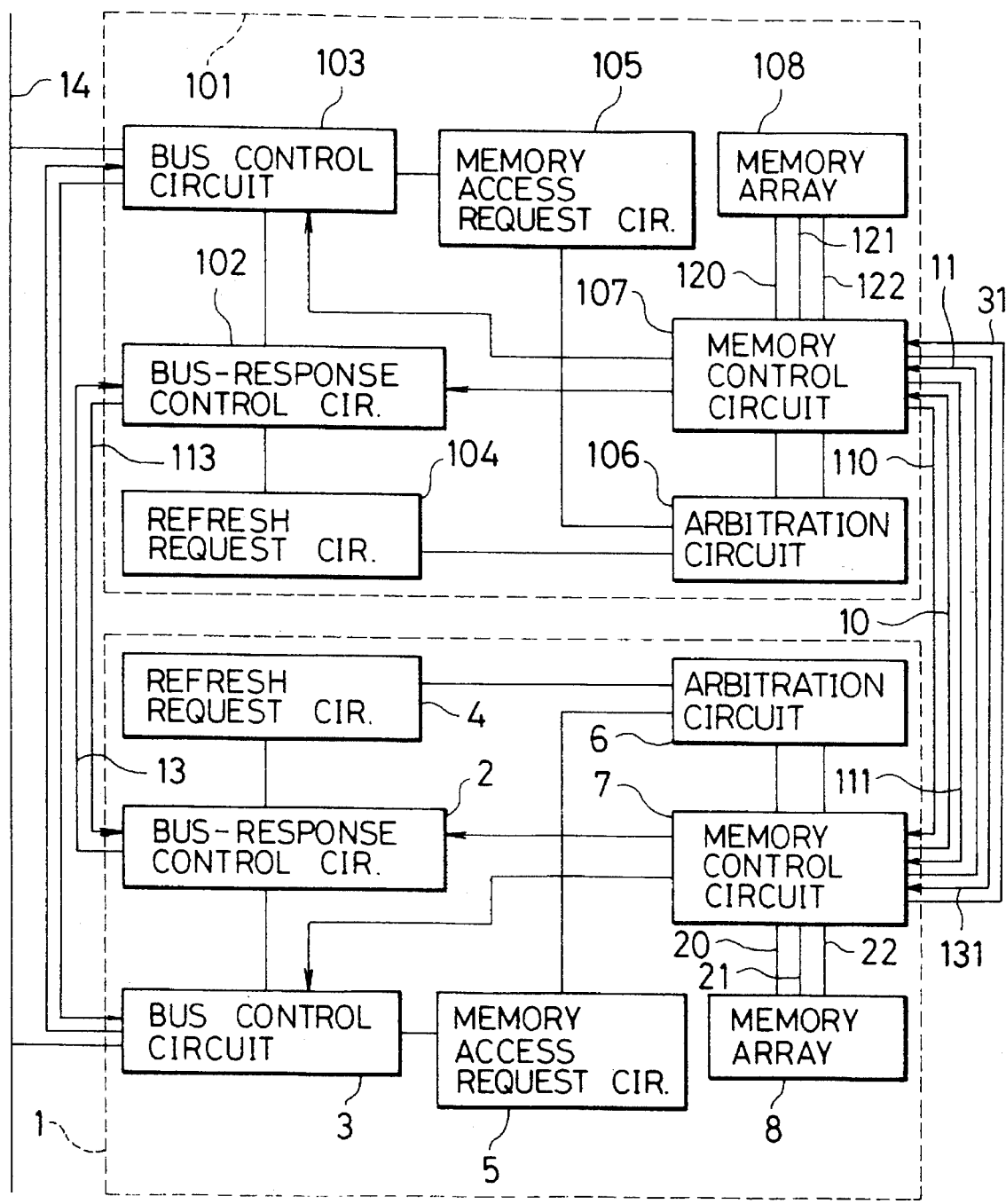
FIG. 22 shows a configuration of a multi-memory apparatus of the invention according to another embodiment.

Synchronous refresh operation performed between the memory units in a multi-memory apparatus is one of the most significant features in the present invention. Another embodiment here introduces a different type of multi-memory apparatus which performs synchronous refresh request operation between the memory control circuits instead of the refresh request circuits. FIG. 22 shows the configuration of a multi-memory apparatus according to the embodiment, which requires refresh cycle notification lines between the memory control circuits instead of the refresh request notification lines between the refresh request control circuits. In this case the memory control circuits require additional functions for notifying the partner circuit of its refresh trigger and for driving the bus control circuit to delay a bus response on the system bus until the partner circuit completes the current refresh operation in order to secure system operation in full synchronism.

Figure 23:
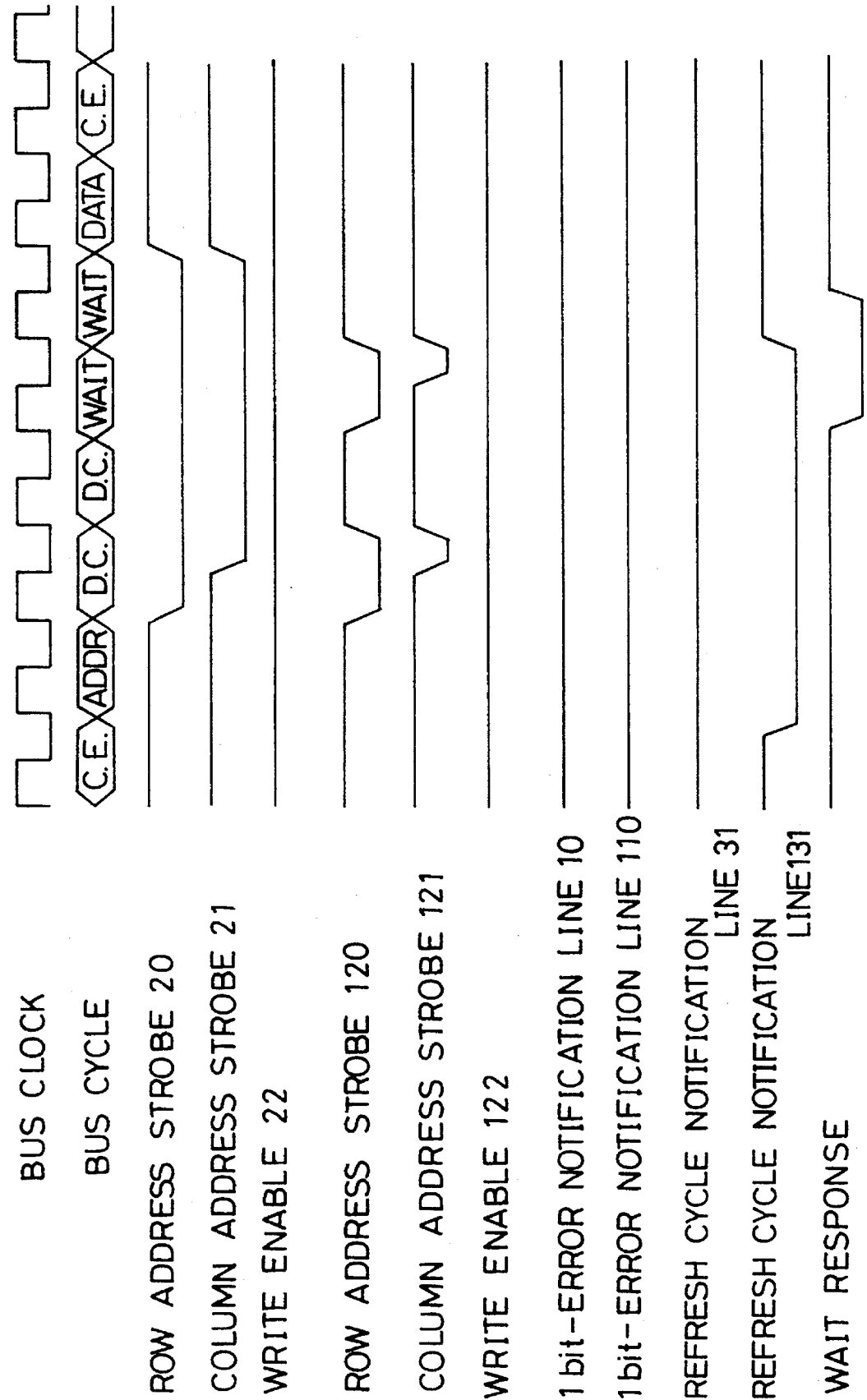
FIG. 23 shows a set of timing diagrams illustrating an operation of a multi-memory apparatus of the invention in the event of a refresh request issued only in the backup memory during a read operation in FIG. 22.

Operation of a multi-memory apparatus according to the embodiment in the event of a memory-refresh request issued in the partner memory unit during a read operation is now described with reference to FIGS. 22 and 23. FIG. 23 shows a set of timing diagrams illustrating operation of a multi-memory apparatus in the event of a memory-refresh request issued only in the backup memory during a read operation. The backup memory control circuit 107 notifies the partner master control circuit 7 that the circuit 107 Is performing a refresh operation by way of the refresh cycle notification line 131. The memory control circuit 7 with the notification waits for the partner memory control circuit 107 to finish the current refresh operation by delaying its memory access to the memory array. The bus control circuit 3 notifies the bus master by issuing a bus response delay request or wait request on the system bus of the delayed response caused by the delayed memory access. This method is also applied to the event that only the master memory issues a memory-refresh request in the same situation.

Figure 24:
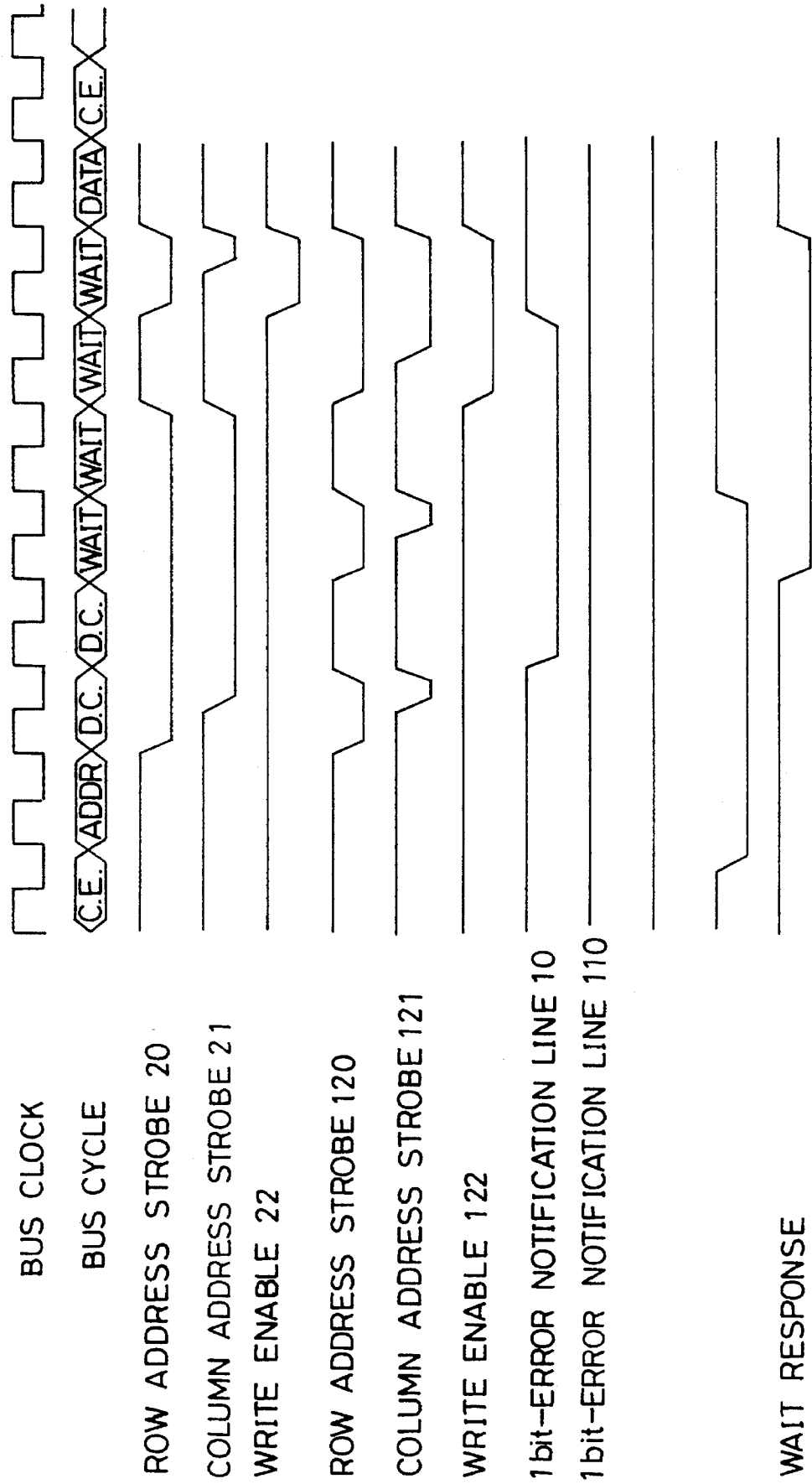
FIG. 24 shows a set of timing diagrams illustrating an operation of a multi-memory apparatus of the invention in the event of one-bit read error detected only in the backup memory in FIG. 22.
Figure 25:
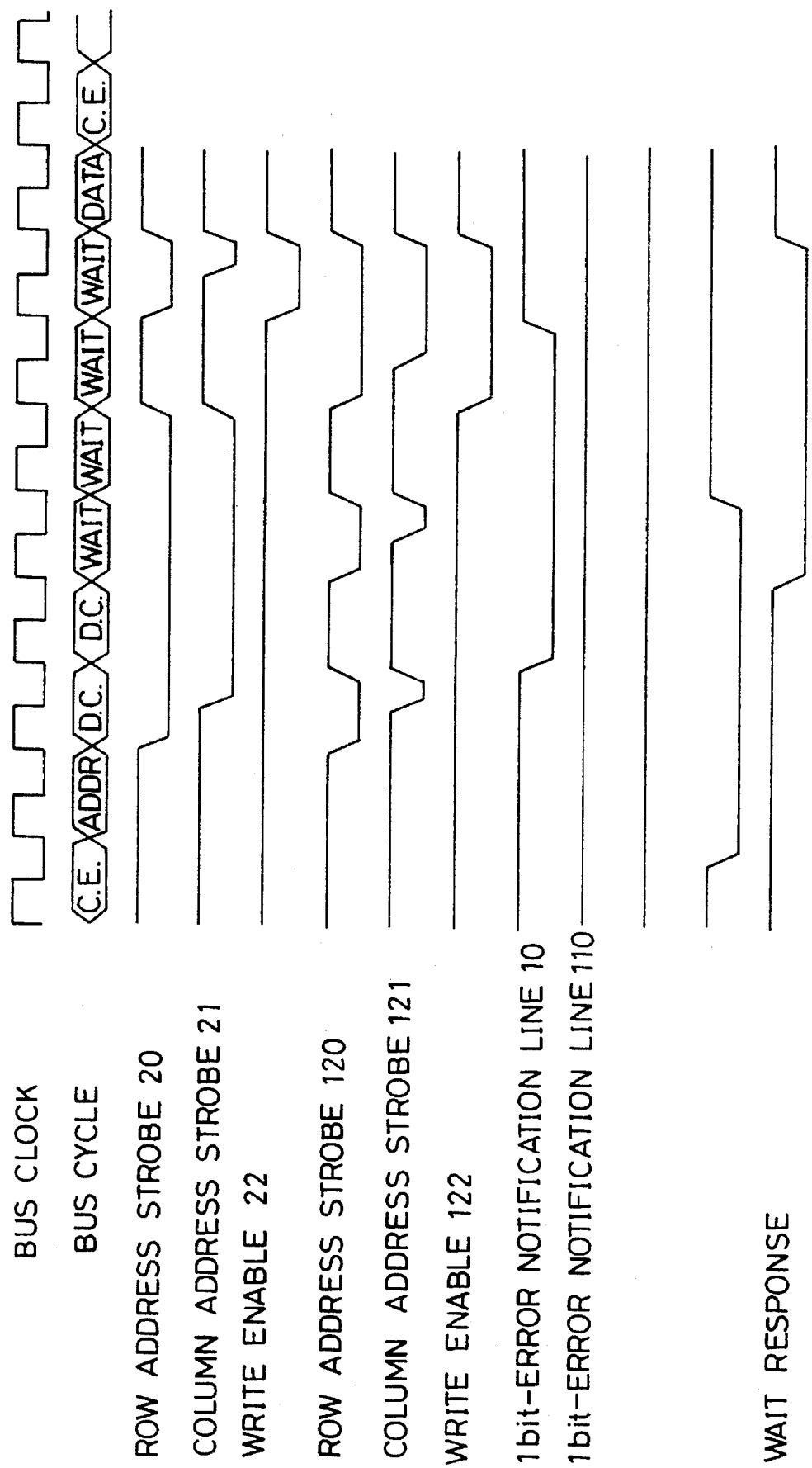
FIG. 25 shows a set of timing diagrams illustrating an operation of a multi-memory apparatus in the invention in the event of a one-bit read error detected only in the master memory in FIG. 22.

FIG. 24 shows a set of timing diagrams illustrating operation of a multi-memory apparatus in the event of a one-bit read error detected only in the backup memory in the above situation. FIG. 25 shows a set of timing diagrams illustrating operation of a multi-memory apparatus in the event of a one-bit read error detected only in the master memory in the same situation as above.

Figure 26:
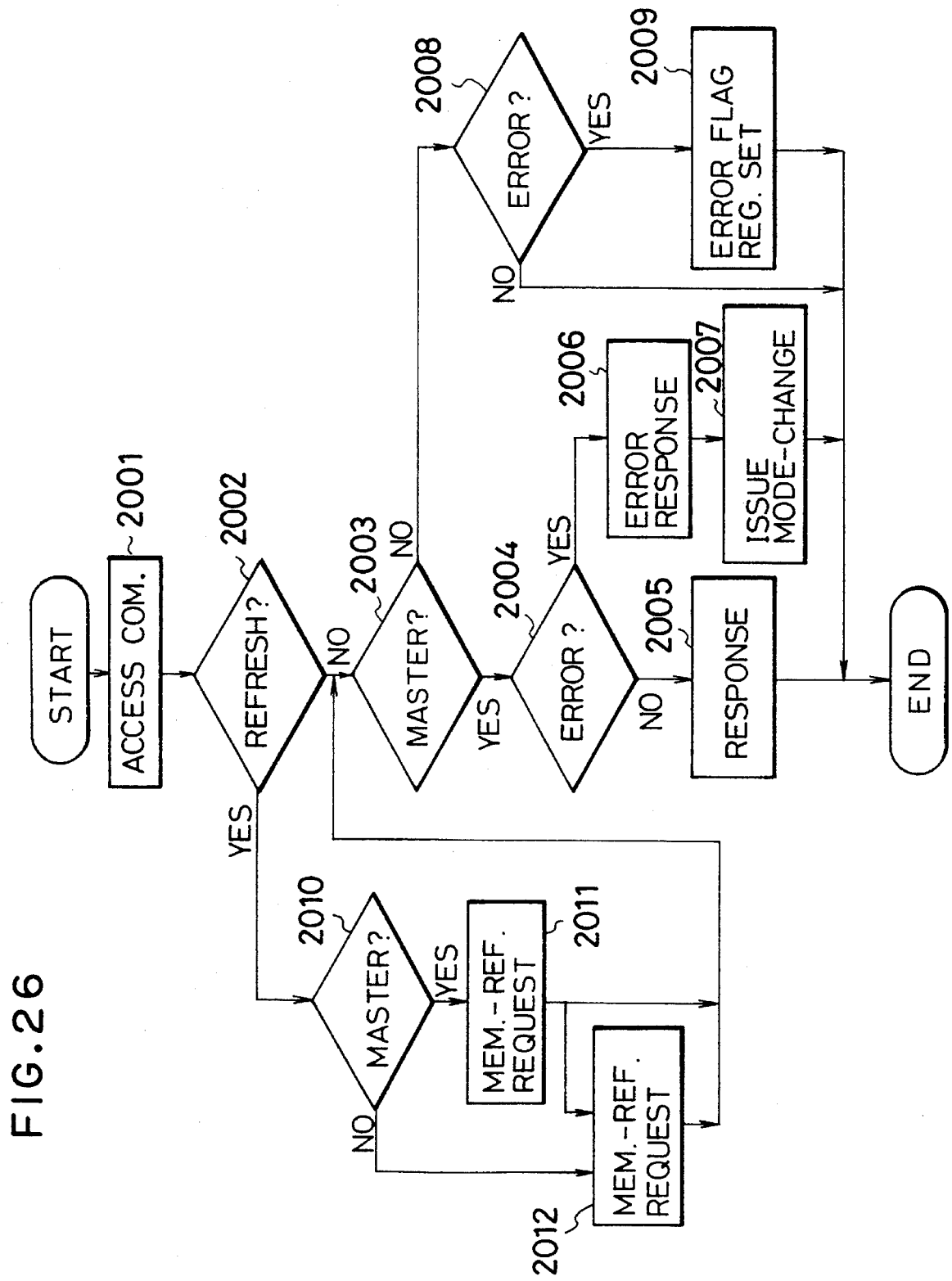
FIG. 26 shows a flow chart illustrating an operation of a bus-response in a multi-memory apparatus of the invention.
Figure 27:
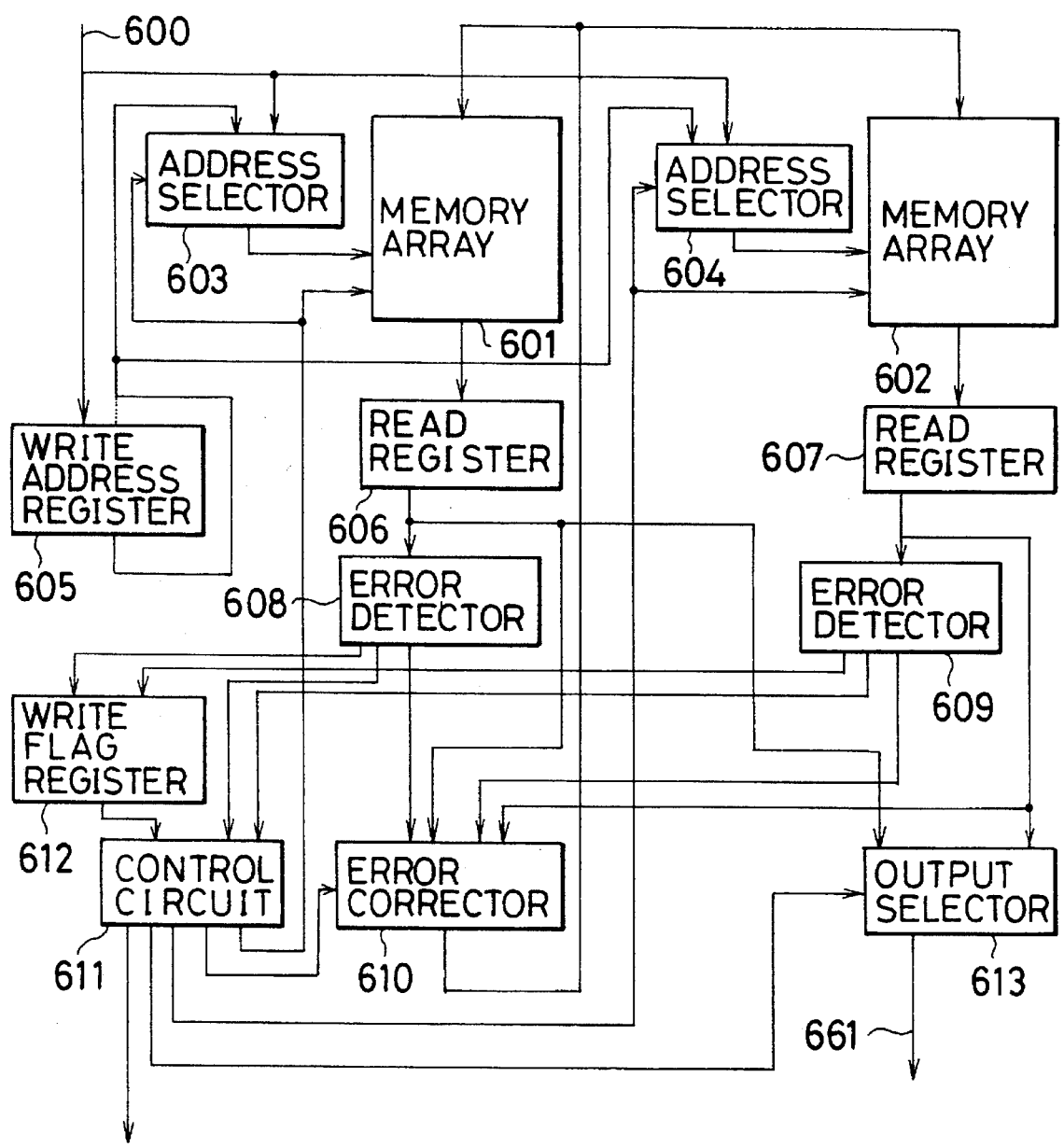
FIG. 27 shows a block diagram illustrating a configuration of a conventional multi-memory apparatus; and, FIG. 28 shows a block diagram illustrating another configuration of a conventional multi-memory apparatus.
Figure 28:
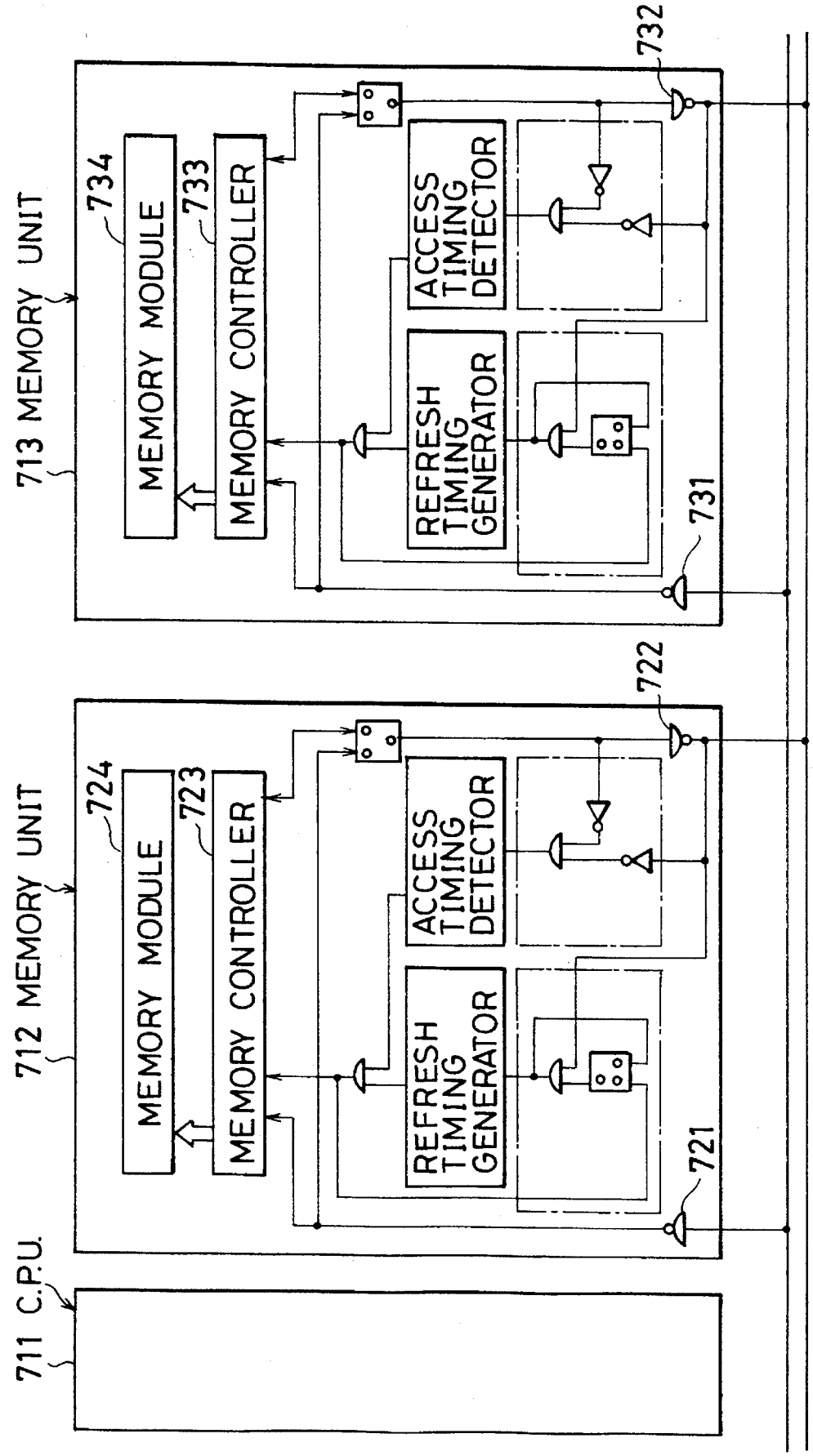

Another embodiment of the invention describes a bus-response operation in a multi-memory apparatus in relation to a refresh operation. A chain of bus-response operation and refresh operation is shown in the following operating sequences with reference to FIGS. 26. FIG. 26 shows a flow chart illustrating the steps.

A bus-response operation starts when the bus master issues an access command for bus-response.

Step 2001. A memory unit receives a bus-response command from the bus master by way of the system bus.

Step 2002. If the memory unit detects a refresh request, processing proceeds to Step 2010. If the memory unit detects no refresh request, processing proceeds to Step 2003.

Step 2003. If the memory unit is in a master mode, processing proceeds to Step 2004. If the memory unit is in a backup mode processing proceeds to Step 2008.

Step 2004. A check is made of whether any error has occurred in the master memory. If there is no error detected, processing proceeds to Step 2005. If there is a detected error, processing proceeds to Step 2006.

Step 2005. The master memory performs a bus-response operation.

Step 2006. The master memory detected any error in Step 2004 issues an "ERROR" response to the bus master.

Step 2007. After informing of its error status, the master memory performs a mode-change operation to turn a backup memory.

Step 2008. A check is made of whether any error has occurred in the backup memory. If there is a detected error, processing proceeds to Step 2009. If there is no error detected, the process ends.

Step 2009. The backup memory with a detected error sets the error flag register.

Step 2010. If a refresh request has occurred in Step 2002 in the master memory, processing proceeds to Step 2011. If a refresh request has been detected in the backup memory, processing proceeds to Step 2012.

Step 2011. The master memory with the request issues a memory-refresh request and processing proceeds to Step 2003.

Step 2012. The backup memory with the request issues a memory-refresh request and processing proceeds to Step 2003.

What is claimed is:

1. A multi-memory apparatus which includes plural identical memory units each of which operates in either a master mode, wherein said memory unit functions as a master memory, or a backup mode, wherein said memory units function as backup memories, connected to a system bus, each said memory unit comprising:

(A) a refresh request means for issuing a memory-refresh request, the refresh request means coupled a bus clock on said system bus and coupled to a trigger from said master memory, and the refresh request means is responsive to said bus clock on said system bus while said memory unit is in said master mode, and responsive to said trigger from said master memory while said memory unit is in said backup mode;

(B) a bus control means having a mode input for responding to said system bus while said memory unit is in said master mode, and the bus control means further for prohibiting a response to said system bus while said memory unit is in said backup mode; and (C) a bus-response control means for detecting an error in said master memory, and the bus response control means for indicating on the mode input of the bus control means that said memory unit is in one of said master mode or said backup mode when the error in said master memory is detected.

2. A multi-memory apparatus according to claim 1, wherein each memory unit further comprises an error flag register coupled to the bus response control means for holding an error status corresponding to detecting said error, means for changing mode from said master mode into said backup mode, means for requesting said backup memory to change from said backup mode into said master mode in case of detecting said error in said master memory, and means for preventing from further changing the mode from backup mode when said error flag register holds said error status.

3. A multi-memory apparatus according to claim 2, wherein each memory unit further comprises an error counter coupled to the bus response control means for counting the number of errors which have occurred in said memory unit and been detected by the bus response control means, and means for informing said error flag register to maintain an error status in case that the number of errors counted by said error counter becomes a predefined value.

4. A multi-memory apparatus according to claim 1, wherein each memory unit further comprises a memory array for storing data, memory control means for data access in said memory array, and means for informing completion of access to said bus control means after confirming completion of data access in all said memory arrays of said memory units.

5. A multi-memory apparatus according to claim 1, the bus response control means further including means for detecting a specific error, and wherein each memory unit further comprises a memory array for storing data, memory control means for data writing in said memory array and means for prohibiting data writing in said memory array in case of detecting a specific error.

6. A multi-memory apparatus according to claim 1, the bus response control means further including means for detecting a specific error, and wherein each memory unit further comprises a memory array for storing data, memory control means for data access in said memory array, and means for responding to said system bus through said bus control means after changing mode into said master mode in case that a specific error is detected in said memory array of said previous master memory.

7. A multi-memory apparatus according to claim 1, wherein each bus control means comprises bus-parity error detection means for comparing each parity error detected in said each memory unit, providing said bus-parity error to said system bus after detecting said bus-parity error in said master memory, and requesting said backup memory to change mode into a master mode in case that bus-parity error is detected in said master memory and said bus-parity error detected in said master memory is different from said bus-parity error detected in said backup memory.

8. A multi-memory apparatus according to claim 1, wherein each memory unit further comprises online replacement control means for allowing said backup memory to be detached from said system bus while power is on, allowing said backup memory to be attached to said system bus while power is on.

9. A multi-memory apparatus which includes plural identical memory units each of which operates in either a master mode, wherein said memory unit functions as a master memory, or a backup mode, wherein said memory unit functions as a backup memory, connected to a system bus, each said memory unit comprising:

(A) a refresh request means for issuing a memory-refresh request, the refresh request means coupled a bus clock on said system bus and coupled to a trigger from said master memory, and the refresh request means is responsive to said bus clock on said system bus while said memory unit is in said master mode, and responsive to said trigger from said master memory while said memory unit is in said backup mode;

(B) a bus control means having a mode input for responding to said system bus while said memory unit is in said master mode, and the bus control means further for prohibiting a response to said system bus while said memory unit is in said backup mode;

(C) a bus-response control means for detecting an error in said master memory, and the bus response control means for indicating in the mode input of the bus control means that said memory unit is in one of said master mode or said backup mode when the error in said master memory had been detected; and (D) a copy-status register operative when said memory is in said backup mode, after connecting said memory unit to said system bus, for copying data from said master memory at specific addresses, and for preventing said memory unit from being used as said backup memory until completion of said copying data.

10. A multi-memory apparatus which includes plural identical memory units each of which operates in either a master mode, wherein said memory unit functions as a master memory, or a backup mode, wherein said memory unit functions as backup memory, connected to a system bus, each said memory unit comprising:

(A) a memory array for storing data;

(B) a bus control means having a mode input for responding to said system bus while said memory unit is in said master mode, and the bus control means further for prohibiting a response to said system bus while said memory unit is in said backup mode;

(C) a bus-response control means for detecting an error in said master memory, and the bus response control means for indicating in the mode input of the bus control means that said memory unit is in one of said master mode or said backup mode when the error in said master memory had been detected; and, (D) a memory control means for controlling data access in said memory array, for informing other memory units of a completion of data access, and for delaying said data access until completion of refresh in said memory unit.

11. A multi-memory apparatus according to claim 10, wherein each memory unit further comprises a refresh-request means for issuing said memory-refresh request by using a bus clock, said refresh-request means being reset after changing mode into a backup mode.

12. A method for preparing a backup memory which is connected to a system bus together with a plurality of other memories, including a master memory, and operates in backup mode, said method comprising the steps of:

(A) setting a copy-status register to a not-ready state in said backup memory after connecting to said system bus;

(B) checking a read/write function of said backup memory using at least one specific memory address;

(C) copying data at each memory address by
 (C1) reading a data at specific address from said master memory;
 (C2) writing same data immediately after said reading step into same address of said master memory, and writing said same data into same address in said backup memory;
 (C3) repeating said reading steps (C1) and said writing steps (C2) to required addresses of said memories; and, (D) setting said copy-status register to a ready state after completion of said copying of said required data.

13. A method for responding to a system bus from a multi-memory apparatus which includes plural identical memory units each of which operates in either a master mode, wherein said memory unit functions as a master memory, or a backup mode, wherein said memory units function as backup memories, said method comprising the steps of:

(A) requesting memory-refresh by using a bus clock while said memory unit is in said master mode, and using a trigger from said master memory while said memory unit is in said backup mode;

(B) controlling a bus control means to allow responding to said system bus while said memory unit is in a master mode, and to prohibit responding to said system bus while said memory unit is in a backup mode;

(C) detecting an error in said master memory;

(D) asking for a backup memory to change a backup mode into a master mode after detecting an error in said master mode memory; and, (E) responding to the system bus while said memory unit is in a master mode, and allowing only reception of commands and data from said system bus while said memory unit is in a backup mode.

* * * * *